United States Patent
Lee

(10) Patent No.: US 11,923,179 B2
(45) Date of Patent: Mar. 5, 2024

(54) PLASMA PROCESSING APPARATUS AND METHOD

(71) Applicant: TAIWAN SEMICONDUCTOR MANUFACTURING COMPANY LIMITED, Hsin-Chu (TW)

(72) Inventor: Pei-Yu Lee, Taoyuan (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 204 days.

(21) Appl. No.: 17/368,885

(22) Filed: Jul. 7, 2021

(65) Prior Publication Data

US 2022/0310365 A1 Sep. 29, 2022

Related U.S. Application Data

(60) Provisional application No. 63/166,691, filed on Mar. 26, 2021.

(51) Int. Cl.
*H01J 37/32* (2006.01)

(52) U.S. Cl.
CPC .... *H01J 37/32715* (2013.01); *H01J 37/3244* (2013.01); *H01J 37/32642* (2013.01); *H01J 2237/3321* (2013.01); *H01J 2237/3341* (2013.01)

(58) Field of Classification Search
CPC .......... H01J 37/32119; H01J 37/32449; H01J 37/32642; H01J 37/32715
See application file for complete search history.

(56) References Cited

U.S. PATENT DOCUMENTS

| | | | |
|---|---|---|---|
| 10,395,900 B2* | 8/2019 | Kim | H01J 37/32119 |
| 2007/0215285 A1* | 9/2007 | Kimball | H01J 37/32935 |
| | | | 156/345.48 |
| 2010/0132614 A1* | 6/2010 | Kato | C23C 16/402 |
| | | | 118/723 R |
| 2013/0098554 A1* | 4/2013 | Chhatre | H01J 37/32119 |
| | | | 156/345.33 |
| 2014/0366808 A1* | 12/2014 | Honma | C23C 16/4409 |
| | | | 118/733 |
| 2017/0053782 A1* | 2/2017 | O'Neill | H01J 37/32119 |
| 2017/0114461 A1* | 4/2017 | Takahashi | C23C 16/45563 |
| 2017/0217148 A1* | 8/2017 | Krümpelmann | B29C 64/386 |

* cited by examiner

*Primary Examiner* — Tung X Le

(74) *Attorney, Agent, or Firm* — Cooper Legal Group, LLC

(57) ABSTRACT

A plasma processing apparatus for semiconductor processing includes an injector holder configured to removably mate with a structure defining an interior chamber of a plasma processing apparatus. The injector holder defines a first opening. A sleeve is configured to be received within the first opening, and the sleeve defines a second opening. A gas injector is configured to be received within the second opening of the sleeve.

20 Claims, 22 Drawing Sheets

PLASMA PROCESSING APPARATUS AND METHOD

RELATED APPLICATIONS

This application claims priority to U.S. Provisional Application 63/166,691, titled "INJECTOR APPARATUS FOR SEMICONDUCTOR PROCESSING CHAMBER AND METHOD OF FORMING" and filed on Mar. 26, 2021, which is incorporated herein by reference.

BACKGROUND

Generally, material processing, such as wafer processing during semiconductor fabrication, utilizes one or more process chambers. For example, a wafer may be transferred into a process chamber that is supplied with a reactive gas, such as a plasma gas, through a gas injector to interact with the wafer. The plasma gas reacts with the wafer and/or one or more layers formed on the wafer, for example, during one or more processing cycles as part of fabricating one or more semiconductor devices in, on, and/or from the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
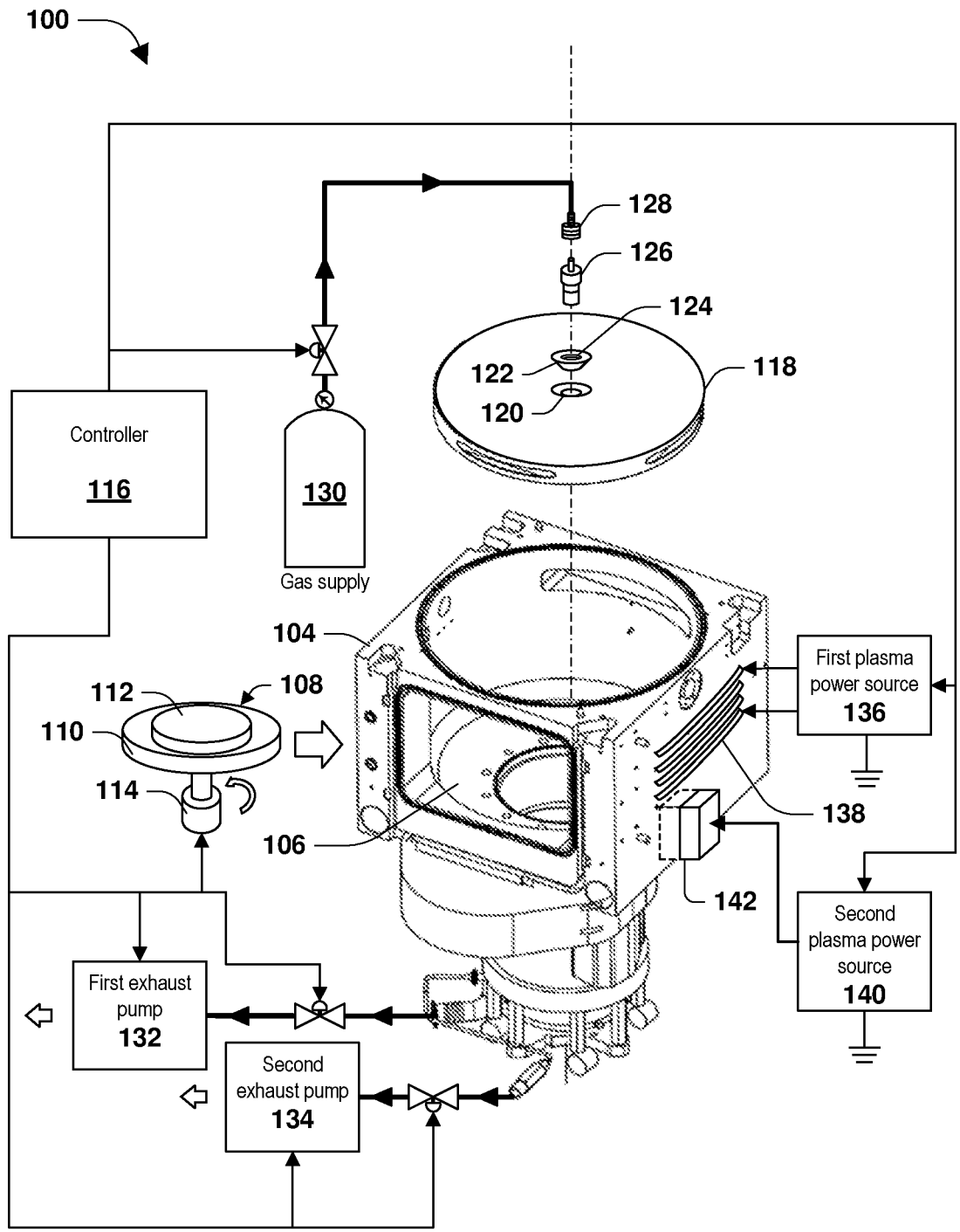
FIG. 1 is a schematic illustration of at least some of a plasma processing apparatus, according to some embodiments.

The following disclosure provides several different embodiments, or examples, for implementing different features of the provided subject matter with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

According to some embodiments, a plasma processing apparatus and associated method are provided. According to some embodiments, an injector holder (e.g., a quartz disk) of the plasma processing apparatus is configured to removably mate with a structure defining an interior chamber of the plasma processing apparatus. The injector holder defines a first opening. The plasma processing apparatus includes a sleeve configured to be received within the first opening of the injector holder. The sleeve defines a second opening. A gas injector is configured to be received within the second opening of the sleeve. According to some embodiments, the sleeve comprises a ceramic and/or other corrosion resistant material (e.g., resistant to corrosion caused by a material injected into and/or generated in the chamber, such as gas, plasma, etc.). In some embodiments, a first fixing feature is provided between the sleeve and the injector holder. In some embodiments, a second fixing feature is provided between the sleeve and the gas injector. In some embodiments, the first fixing feature and/or the second fixing feature may be a sealing member, such as an O-ring. In some embodiments, the first fixing feature and/or the second fixing feature may be a bonding material, such as glue. In some embodiments, the first fixing feature and/or the second fixing feature comprises one or more sealing members, such as one or more O-rings, and/or one or more bonding materials, such as one or more instances of one or more adhesives. The shape of the sleeve may be trapezoidal (e.g., inverted), frustoconical, and/or any other shape(s). According to some embodiments, an outer diameter of a top side of the sleeve, such as facing away from the interior chamber, is greater than an outer diameter of a bottom side of the sleeve, such as facing toward the interior chamber. The first opening is defined within the injector holder coincident with the shape of the sleeve such that the sleeve mates with the injector holder. Additionally, providing the shape of the sleeve with a top side outer diameter greater than a bottom side outer diameter promotes securing the sleeve within the injector holder.

According to some embodiments, a method of forming a plasma processing apparatus includes forming a first opening in an injector holder of the plasma processing apparatus, inserting a sleeve (e.g., a ceramic sleeve) within the first opening in the injector holder, and inserting a gas injector within a second opening in the sleeve. In some embodiments, the method includes providing a first fixing feature between the sleeve and the injector holder. In some embodiments, the method includes providing a second fixing feature between the sleeve and the gas injector. In some embodiments, a first side surface of the injector holder that defines the first opening forms a first acute angle with a vertical axis of the injector holder. In some embodiments, the sleeve is formed to have a second side surface that forms a second acute angle with a vertical axis of the sleeve and that is coincident with the first acute angle such that the first side surface mates with the second side surface. In some embodiments, at least one of a first O-ring or a first bonding material is provided between the injector holder and the sleeve. In some embodiments, at least one of a second O-ring or a second bonding material is provided between the gas injector and the sleeve. A corrosive material within the semiconductor processing chamber may be a corrosive gas and/or plasma. Because a resistance to corrosion of the (e.g., ceramic) sleeve is greater than a resistance to corrosion of the (e.g., quartz) injector holder and/or gas injector, the sleeve inhibits leakage that might otherwise occur at or near locations where the gas is injected into the plasma processing apparatus, such as where the gas injector passes through the injector holder. Inhibiting leakage increases the life expectancy of the plasma processing apparatus, thereby reducing costs. Generally, the gas injector is a smaller and/or less expensive component than the injector holder such that even if corrosion of the gas injector occurs, while the gas injector is in the sleeve, replacing the gas injector is a less expensive option than replacing the injector holder.

FIG. 1 is a schematic illustration of a plasma processing apparatus 100 for semiconductor processing, according to some embodiments. For example, the plasma processing apparatus 100 comprises a structure 104 defining an interior chamber 106. According to some embodiments, a gas is injected into the interior chamber 106, which is formed into a plasma for semiconductor processing. A material support structure 108 is disposed within the interior chamber 106. The material support structure 108 includes a stage 110 to support a material 112, such as a semiconductor wafer. According to some embodiments, the stage 110 is rotated within the interior chamber 106 by a motor 114 in response to control by a controller 116. An injector holder 118 removably mates with the structure 104 and defines an opening 120. A sleeve 122 is configured to be received within the opening 120 of the injector holder. The sleeve 122 defines an opening 124 to receive a gas injector 126. The gas injector inputs the gas into the interior chamber 106, and receives the gas from a fitting 128 connected to a gas supply 130. According to some embodiments, the processing gas is an etching gas, a deposition gas, a treatment gas, a carrier gas, such as nitrogen, argon, etc., and/or other suitable gases.

In some embodiments, interior chamber 106 is coupled to a first exhaust pump 132 and/or a second exhaust pump 134 to exhaust gas from within the interior chamber 106. According to some embodiments, the first exhaust pump 132 provides a vacuum state at or below atmospheric pressure, such as below about 5 Torr. For example, the vacuum state may be an initial vacuum state to exhaust ambient air from within the interior chamber 106. In some embodiments, the first exhaust pump 132 is operable to maintain the interior chamber 106 at a pressure in a range from about 1 mTorr to about 100 mTorr. In some embodiments, the second exhaust pump 134 is provided to exhaust reacted gas from the interior chamber 106. For example, the vacuum pressure may be maintained within the interior chamber 106 during exhausting of the reacted gas by the second exhaust pump while additional, non-reacted gas is supplied from the gas supply 130. According to some embodiments, the first exhaust pump 132 and/or the second exhaust pump 134 may include one or more pumps, and/or may utilize multiple pumping technologies, such as a positive displacement pump, a momentum transfer pump, a regenerative pump, and/or an entrapment pump. Various pumps may be configured in series and/or in parallel according to respective processing operations to be performed on the material 112.

According to some embodiments, the plasma processing apparatus 100 includes a first plasma power source 136, such as a radio frequency (RF) power source (e.g., a magnetron), coupled to a plasma antenna, such as a coil 138 for processing with an inductively coupled plasma. In some embodiments, the plasma antenna may include plates, such as for processing with a capacitively coupled plasma. The first plasma power source 136 is coupled to the coil 138 through RF impedance matching circuitry (not shown). In some embodiments, the coil 138 encircles the interior chamber 106. In some embodiments, the coil 138 is positioned above the interior chamber in a wave guide (not shown). In some embodiments, the coil 138 is separated from the interior chamber 106 by a window, such as a dielectric window, to permit RF energy provided from the coil 138 to be input into the interior chamber 106. The coil 138 provides RF energy that is operable to maintain an inductively coupled plasma from the processing gas within the interior chamber 106 for etching, deposition, and/or plasma treatment of the material 112. According to some embodiments, the plasma processing apparatus 100 includes a second plasma power source 140 connected to an electrical component 142. In some embodiments, the electrical component is a coil to tune and/or direct the RF energy emitted by coil 138. In some embodiments, the electrical component 142 is a permanent magnet and/or electrical magnet to direct the RF energy emitted by the coil 138. In some embodiments, the first plasma power source 136 and the second plasma power source 140 separately control the RF energy provided to the coil 138 and/or the electrical component 142, such as when the electrical component 142 is another coil, to control generation of plasma about first and/or second regions of the material 112. In some embodiments, the coil 138 maintains a high plasma density, such as in a range from about $10^9$ ions/cm$^3$ to about $10^{12}$ ions/cm$^3$, such as from about $10^{10}$ ions/cm$^3$ to about $10^{12}$ ions/cm$^3$. In some embodiments, continued operation of the plasma processing apparatus 100, such as greater than 3000 hours, may have a deleterious effect on the injector holder 118 such that the opening 120 becomes larger. Plasma and/or gas from within the interior chamber 106 may leak around the opening 120 when same has been enlarged through continued operation of the plasma processing apparatus 100. Upon removal of the injector holder 118 from the plasma processing apparatus 100, the opening 120 may be enlarged, such as through machining. The sleeve 122 may then be secured within the opening 120 and the sleeve may retain the gas injector 126. An operational life cycle of the injector holder 118 and/or the plasma processing apparatus 100 may be extended.

According to some embodiments, the coil 138 is a planar multi-turn spiral coil, a non-planar multi-turn spiral coil, or a coil having another appropriate shape. In some embodiments, the plasma can be maintained by other plasma antennas, such as electron cyclotron resonance (ECR), parallel plate, helicon, helical resonator, or other plasma antennas. In some embodiments, the plasma processing apparatus 100 is configured to facilitate dry etching, also known as reactive ion etching (RIE) or ion-assisted chemical vapor etching. In some embodiments, the material 112 is placed within the interior chamber 106 between the coil 138 configured as an anode and the electrical component 142 configured as a cathode. The electrical component may form part of the stage 110. As gas is input into the interior chamber 106, the gas forms a plasma state, which is dissociated and/or highly reactive. In some embodiments, the gas is tetrafluoromethane (CE), also known as carbon tetrafluoride, which is fairly inert under normal conditions. Upon entering the plasma state, $CF_4$ generates many F atoms in the form of free radicals, which are highly reactive and/or spontaneously attack silicon to produce tetrafluorosilane ($SiF_4$), also known as silicon tetrafluoride. Because $SiF_4$ is a gas, silicon may be readily turned to a gas in response to the plasma reaction. In addition, ions in the plasma may bombard the cathode similar to sputtering. This action may create an additional source of energy that can accelerate an etch rate. Because ions are directed at a normal incidence to the cathode, this may have an effect of accelerating the etch rate normal to the material 112. When the material 112 is silicon or contains silicon, a resulting etch profile may be provided with little to no undercut and/or that is anisotropic.

In some embodiments, the interior chamber 106 of the plasma processing apparatus 100 may be any type of wafer processing chamber that utilizes reactive material, such as reactive plasma gas, in wafer processing, such as wet clean processing (e.g., cleaning by solvents such as acetone, trichloroethylene, ultrapure water, etc.), surface passivation, photolithography, ion implantation (e.g., embedding dopants in regions of the material 112), etching (e.g., dry etching, plasma etching, reactive-ion etching (RIE), atomic layer etching (ALE), buffered oxide etching, etc.), plasma ashing, thermal treatments (e.g., rapid thermal anneal, furnace anneals, thermal oxidation, etc.), vapor deposition (e.g., chemical vapor deposition (CVD), atomic layer deposition (ALD), physical vapor deposition (PVD)), molecular beam epitaxy (MBE), electrochemical deposition (ECD), chemical-mechanical polishing (CMP), etc. The interior chamber 106 of the plasma processing apparatus 100 may be a wafer transfer tool, such as a cluster tool, that facilitates transfer of the material 112 into another processing chamber or another component of a processing chamber. The plasma processing apparatus 100 may be connected to other processing equipment, such as a front opening unified pod (FOUP), which is an enclosure configured to hold a plurality of wafers in a controlled environment and/or to facilitate transfer to other processing and/or manufacturing equipment. According to some embodiments, the interior chamber 106 is shown as a plasma processing chamber that receives gas to be formed into plasma gas, that may include source reactive materials and/or a carrier gas for processing the material 112.

According to some embodiments, the interior chamber 106 of the plasma processing apparatus 100 is operable to perform a plasma etch process, such as plasma etching of metal, dielectric, semiconductor, and/or mask materials from the surface of the material 112. In some embodiments, the interior chamber 106 is operable to perform a deposition process, such as plasma deposition of metal, dielectric, semiconductor, and/or mask materials over the surface of the material 112. In some embodiments, the interior chamber 106 is operable to perform a plasma treatment, such as plasma treatment of metal, dielectric, semiconductor, and/or mask materials on the surface of the material 112. For example, the gas injector 126, or a plurality of gas injectors delivering gas within the interior chamber, can be made of metal or ceramic. Other suitable materials include anodized aluminum, aluminum alloy, ceramic, and/or other corrosion resistant materials and/or corrosion resistant coatings.

According to some embodiments, the sleeve 122 is a ceramic, such as alumina, yttria, and/or aluminum nitride (AlN). Alumina is a fine ceramic material with chemical and/or physical stability. Thermal properties of alumina includes high heat resistance and/or high thermal conductivity. Mechanical properties of alumina include high strength and/or high hardness. Other properties of alumina include high electrical insulation and/or high corrosion resistance. AlN offers high thermal conductivity and/or high electrical insulation properties. Alumina, yttria, and/or AlN provide resistance to a corrosive environment associated with reactive gas plasma, such as used in etching, chemical vapor deposition (CVD), physical vapor deposition (PVD) processes, etc. Technical ceramics may include carbides and/or nitrides, such as silicon carbide (SiC) and/or pyrolitic boron nitride (PBN). SiC provides high thermal conductivity and/or stability in high thermal and/or corrosive chemical environments, such as rapid thermal processing (RTP) applications.

In some embodiments, the gas injector 126 is made of metal materials, such as aluminum, stainless steel, etc., dielectric materials, such as quartz, alumina, silicon nitride, etc., and/or other suitable materials. The gas injector 126, the injector holder 118, and/or the sleeve 122 may be made of a polymer, a metal, a dielectric material, a quartz material, a ceramic material, and/or other suitable materials. Examples of suitable polymers include fluoropolymers, polyetherimide, polycarbonate, polyetheretherketone (PEEK), polyimide, and/or other suitable polymers. Examples of ceramic material include alumina, ceria, yttria, zirconia, and/or other suitable ceramic materials. According to some embodiments, the injector holder 118 is quartz, such as fused quartz, fused silica, quartz glass, etc. According to some embodiments, the injector holder 118 is comprised of a doped quartz material blended with a material comprised of yttrium to form a mixture. According to some embodiments, the injector holder 118 is fused quartz produced by fusing high-purity silica sand, which comprises quartz crystals. The fused quartz may be: Type I, such as produced by induction melting natural quartz in a vacuum or an inert atmosphere; Type II, such as produced by fusing quartz crystal powder in a high-temperature flame; Type III, such as produced by burning $SiCl_4$ in a hydrogen-oxygen flame; Type IV, such as produced by burning $SiCl_4$ in a water vapor-free plasma flame, and/or other type of fused quartz. According to some embodiments, the quartz and/or fused quartz may include silicon and oxygen, and/or a combination of silicon, oxygen, and/or an impurity, such as a material containing aluminum, titanium, or yttrium, etc.

In some embodiments, the coil 138 maintains the plasma at a high density state, such as a plasma density in a range from about $10^9$ ions/cm$^3$ to about $10^{12}$ ions/cm$^3$, such as from about $10^{10}$ ions/cm$^3$ to about $10^{12}$ ions/cm$^3$. The coil 138 may be a planar multi-turn spiral coil, a non-planar multi-turn spiral coil, or a coil having another appropriate shape. In some embodiments, the plasma can be maintained by other plasma antennas, such as electron cyclotron resonance (ECR), parallel plate, helicon, helical resonator, and/or other plasma antennas.

Plasma etching, also known as plasma-assisted etching, provides radicals created in a glow discharge to chemically react with the material 112 to be etched to form a volatile (gaseous) reaction product at the temperature of the etched surface. A common example of a plasma etching process is set forth by equation 1 as follows:

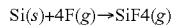    Equation 1 where (s) refers to a solid and (g) refers to a gas, respectively. The SiF$_4$ formed in the reaction of equation 1 evaporates from the etched surface of the material 112 before being pumped away by the first exhaust pump 132 and/or the second exhaust pump 134. A vapor pressure of about $10^{-4}$ Torr or higher may be provided within the interior chamber 106. The plasma etching utilizes a chemical reaction leading to volatile product formation that is exothermic. An endothermic process generally does not result in etching. The environment within the interior chamber 106 is controlled by the controller 116 to balance the exothermic process and/or the endothermic process to provide the etching of silicon with high selectivity to SiO$_2$, such as no etching of SiO$_2$ by using chlorine and/or bromine based chemistries.

In some embodiments, the controller 116 is communicatively coupled to the first plasma power source 136 and the second plasma power source 140 to control formation of the plasma within the interior chamber 106. In some embodiments, the controller 116 is communicatively coupled to a supply valve to control introduction of reactive gas within the interior chamber 106. In some embodiments, the controller 116 is communicatively coupled to the first exhaust pump 132, the second exhaust pump 134, and/or corresponding exhaust valves to control exhaustion of gas from within the interior chamber 106. In some embodiments, the controller 116 is communicatively coupled to the motor 114 to control rotation of the material 112 during reaction with the plasma to provide a uniform distribution of the reaction.

According to some embodiments, the injector holder 118 has a first material composition, such as quartz and/or a material set forth above, the sleeve 122 has a second material composition, such as ceramic and/or a material set forth above, and the gas injector 126 has a third material composition, such as metal or a material set forth above. According to some embodiments, the first material composition is the same as the second material composition, such as quartz, ceramic, metal, or another material set forth above. According to some embodiments, the second material composition is the same as the third material composition, such as quartz, ceramic, metal, or another material set forth above. A removal rate of the second material composition by a plasma generated in the interior chamber 106 is less than at least one of a removal rate of the first material composition by the plasma generated in the interior chamber 106 or a removal rate of the third material composition by the plasma generated in the interior chamber. Other arrangements and/or configurations of the controller 116, the first plasma power source 136, the second plasma power source 140, the first exhaust pump 132, the second exhaust pump 134, the gas supply 130, and/or the material support structure 108 are within the scope of the present disclosure.

Figure 2A:
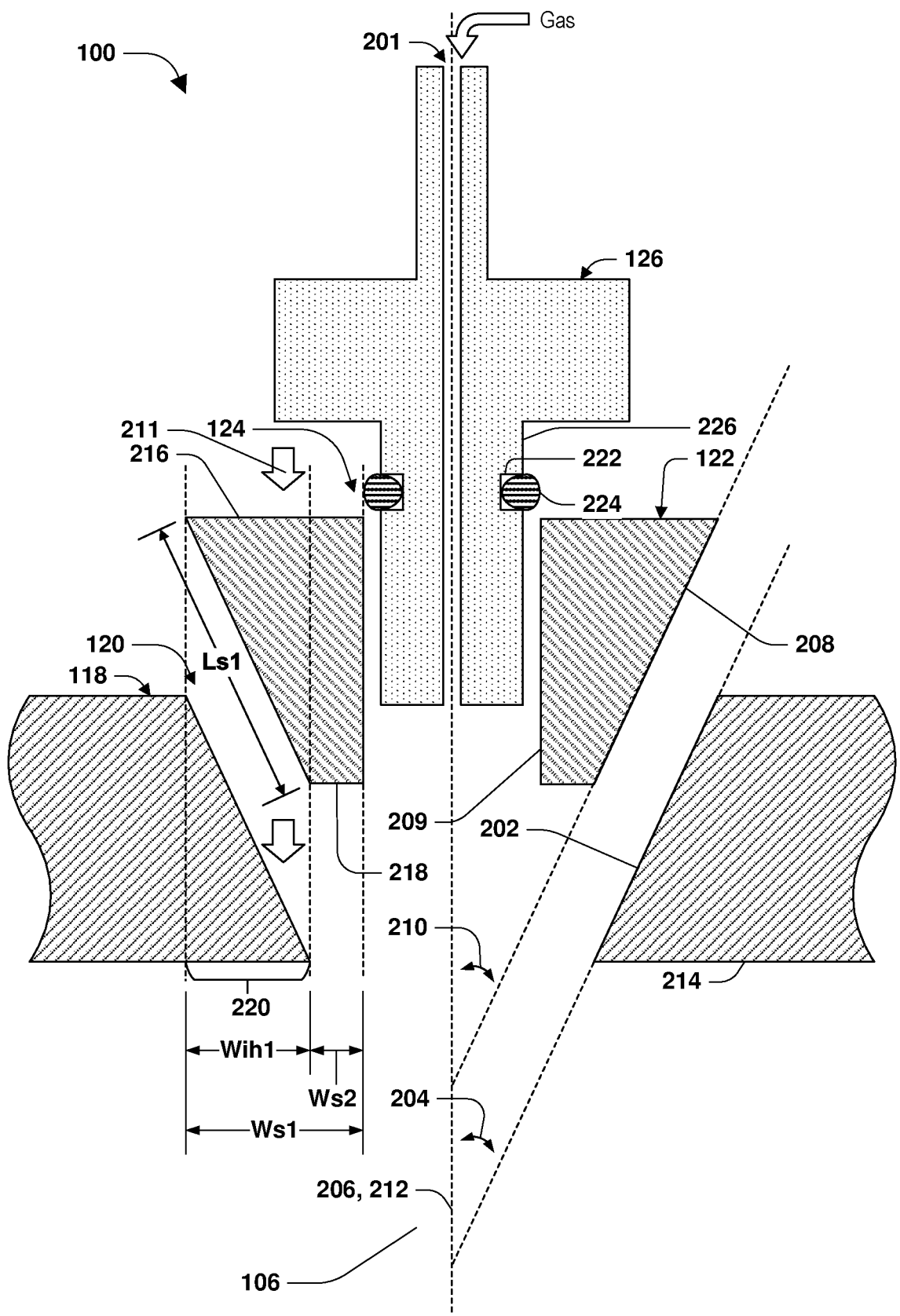
FIGS. 2A-2N are schematic illustrations of at least some of a plasma processing apparatus, such as an injector holder, a sleeve, and/or a gas injector of the plasma processing apparatus, according to some embodiments.
Figure 2B:
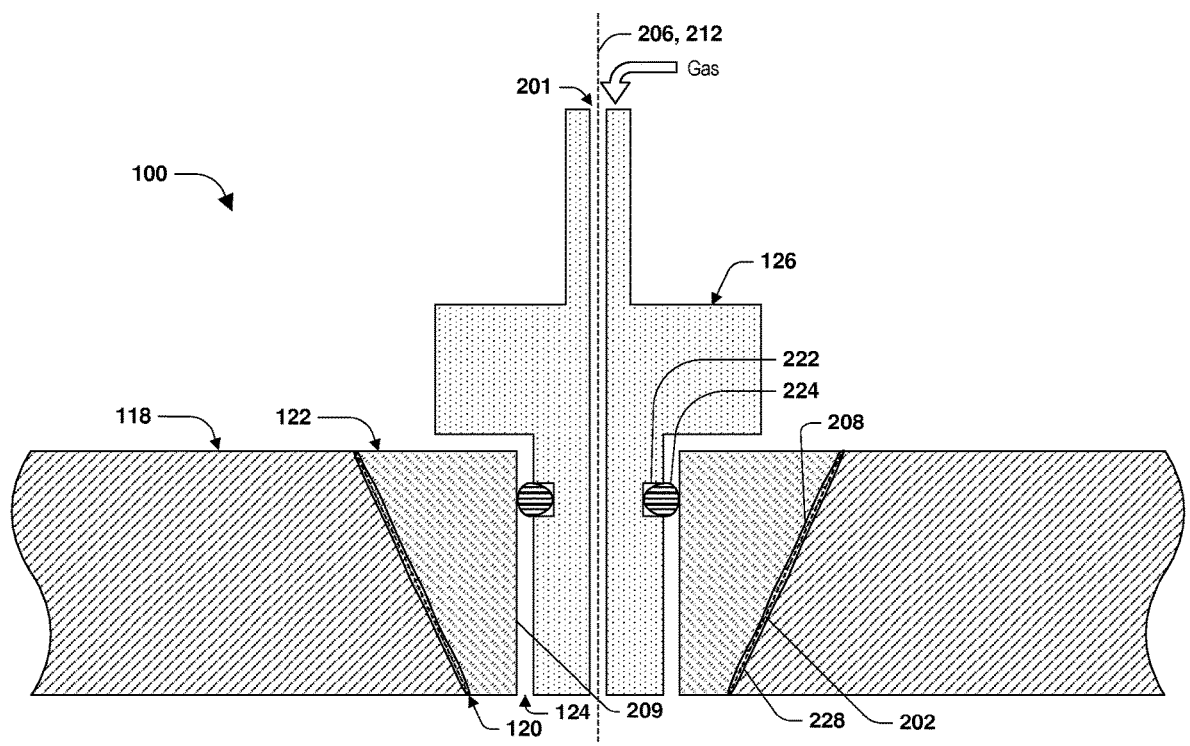
Figure 2C:
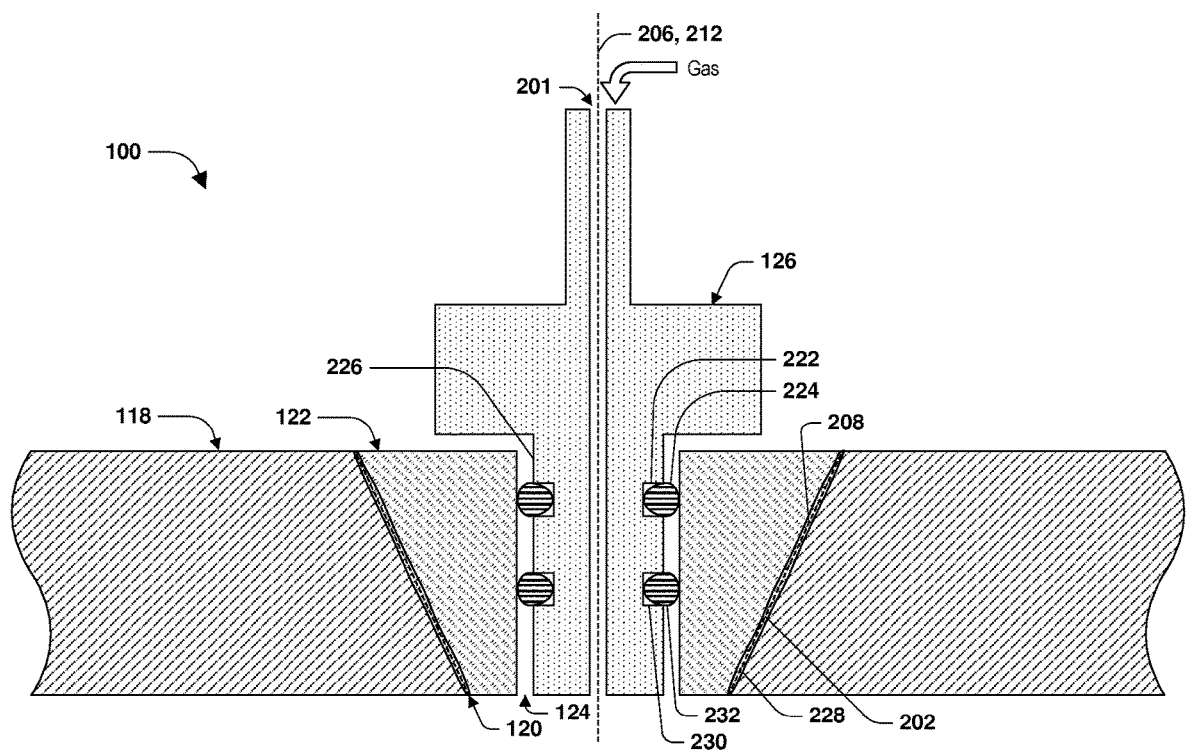
Figure 2D:
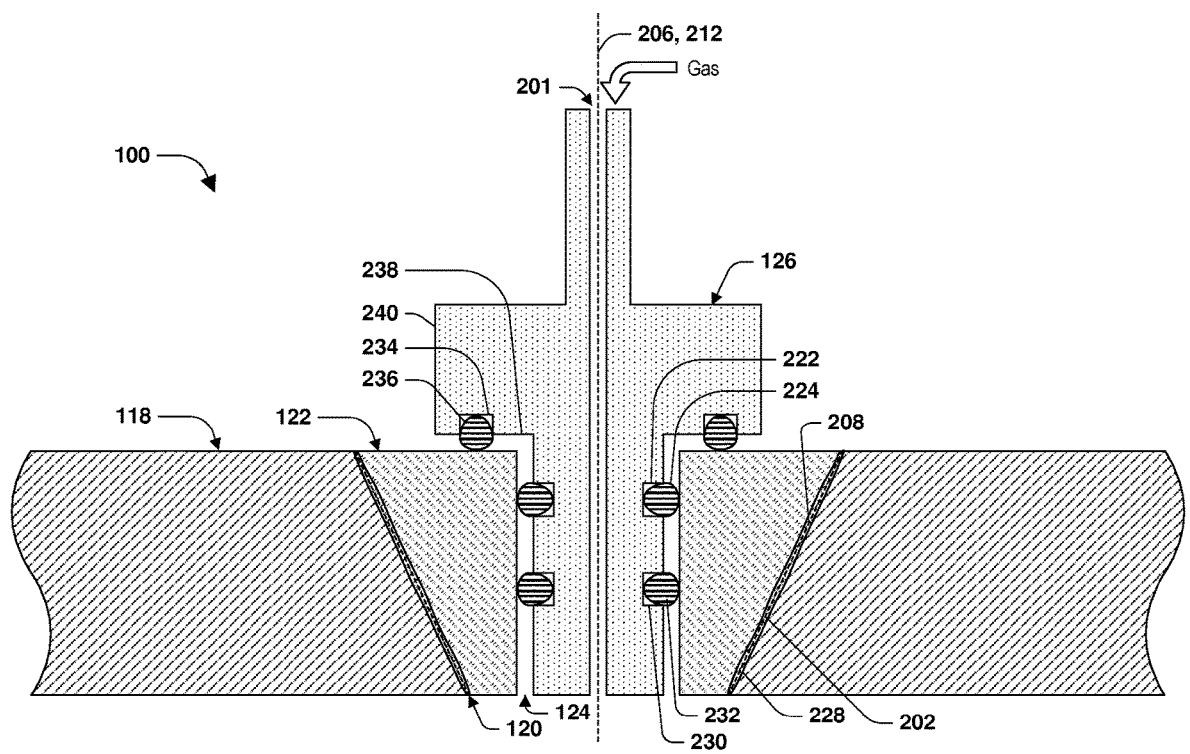
Figure 2E:
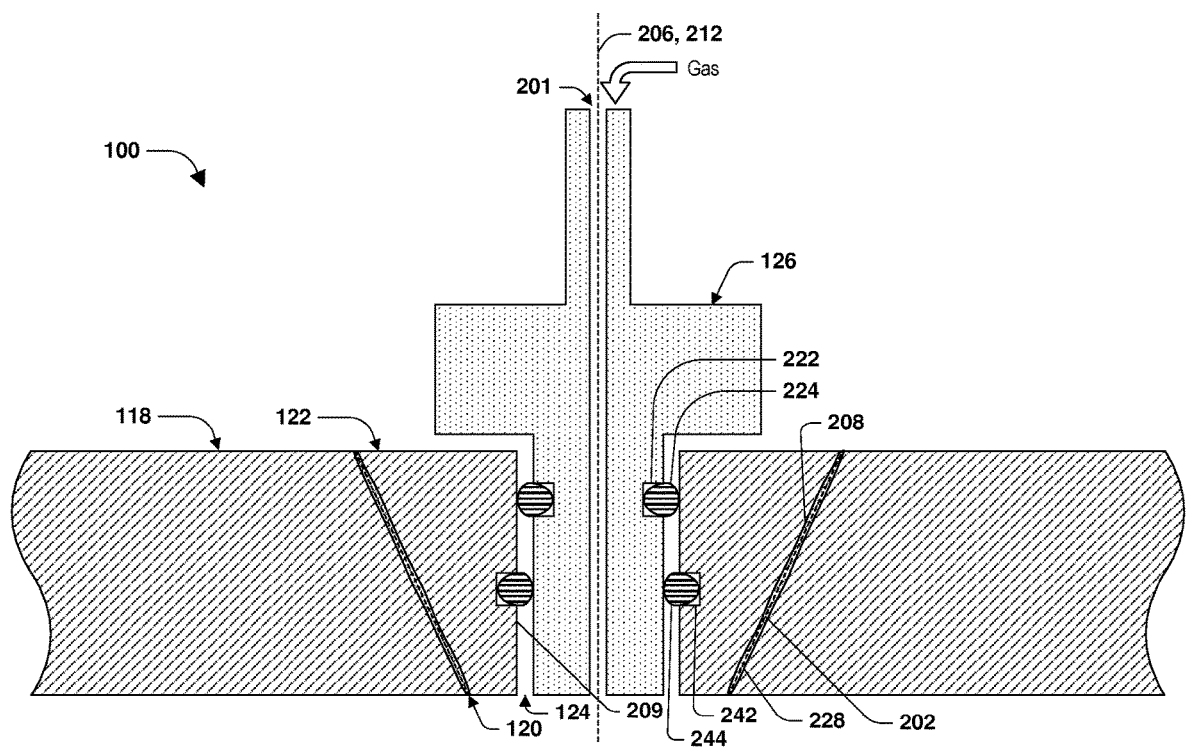
Figure 2F:
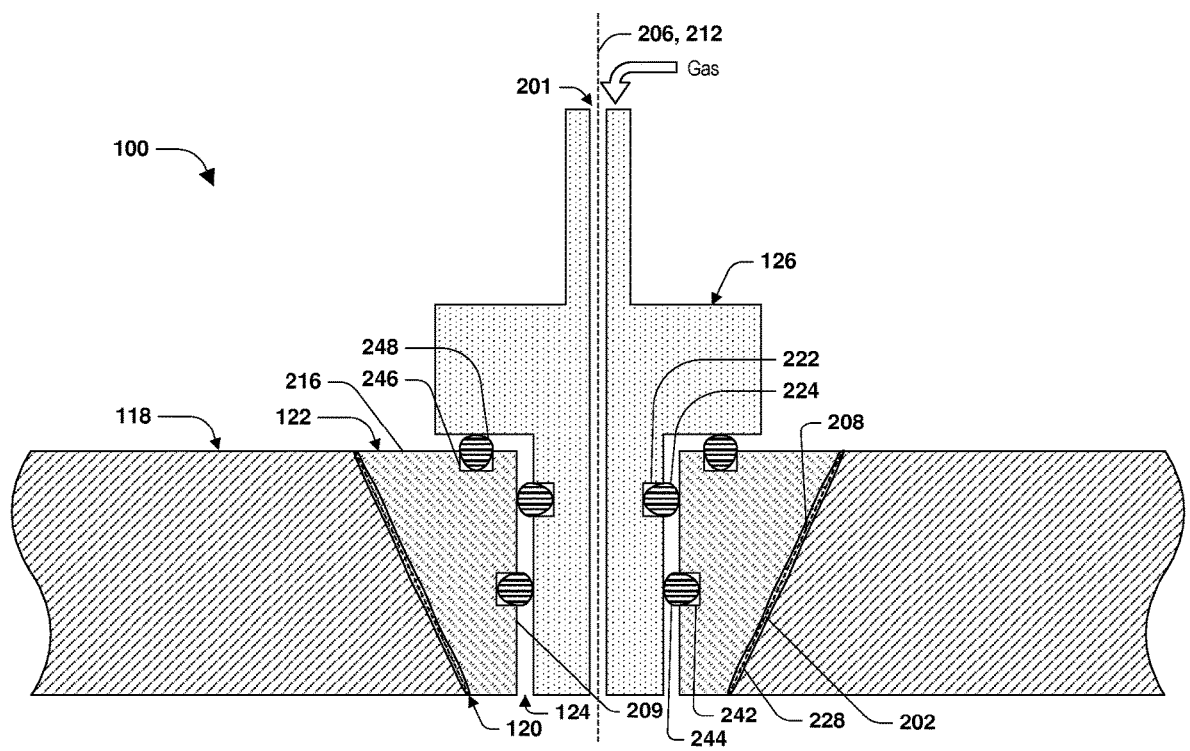
Figure 2G:
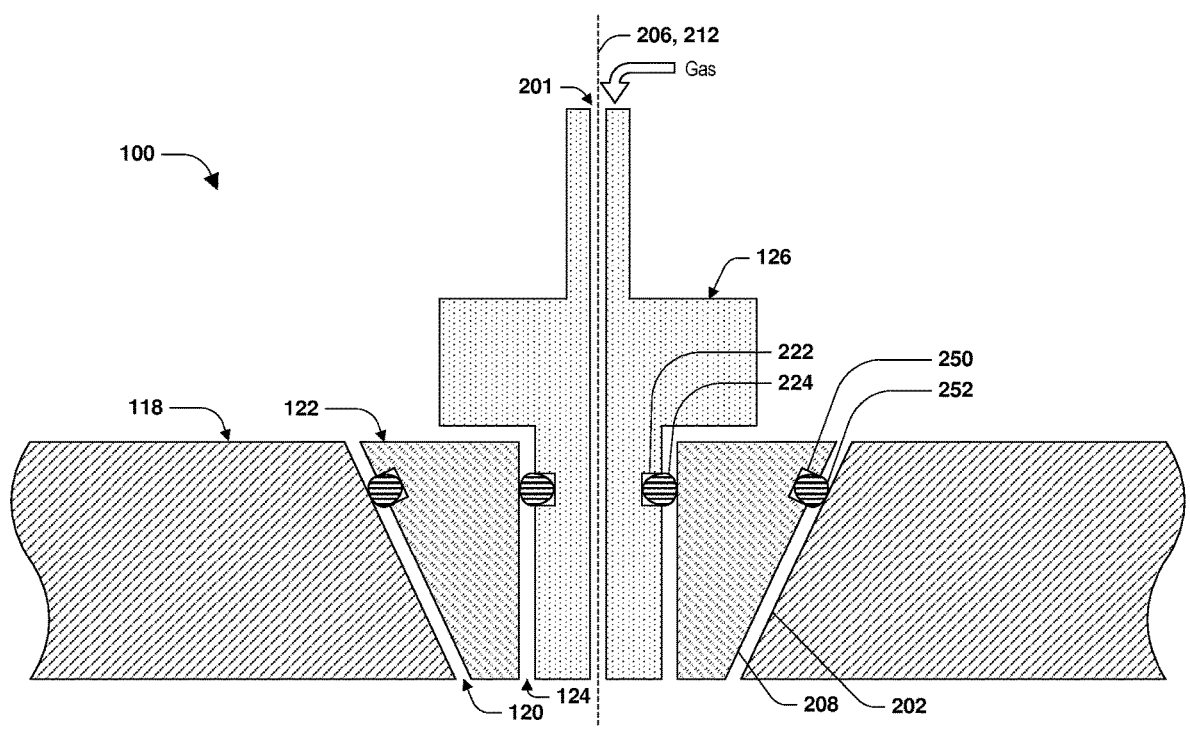
Figure 2H:
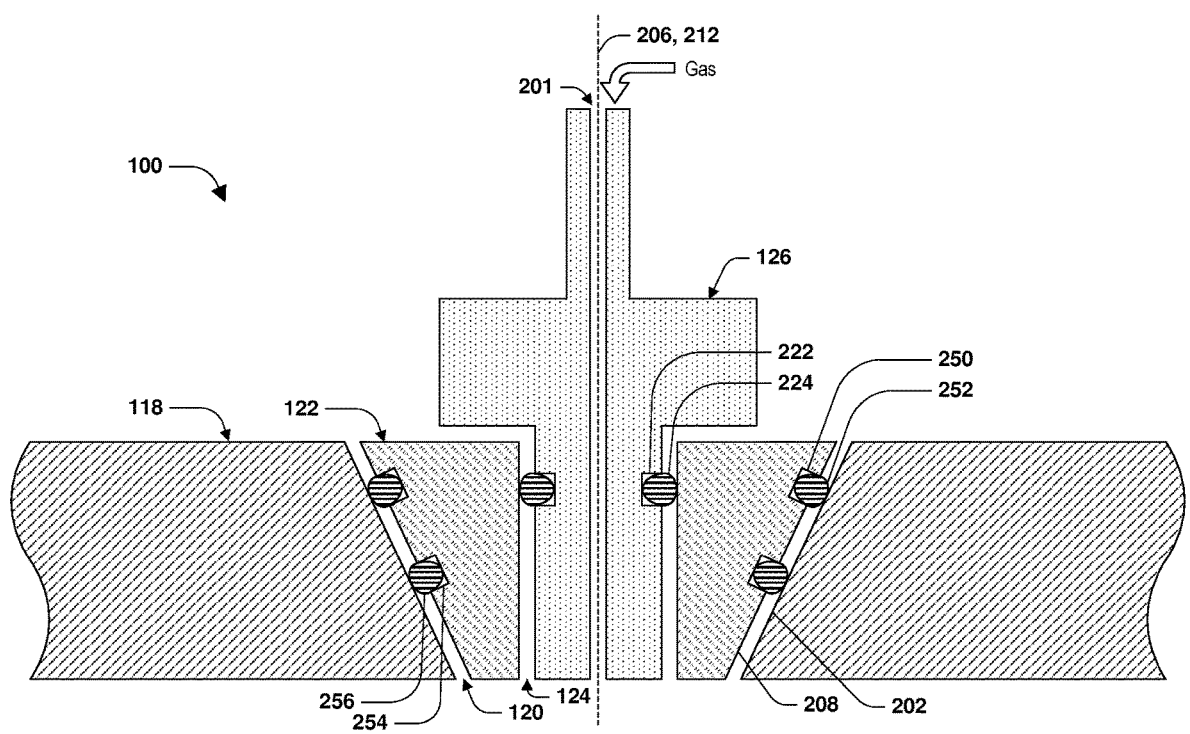
Figure 2I:
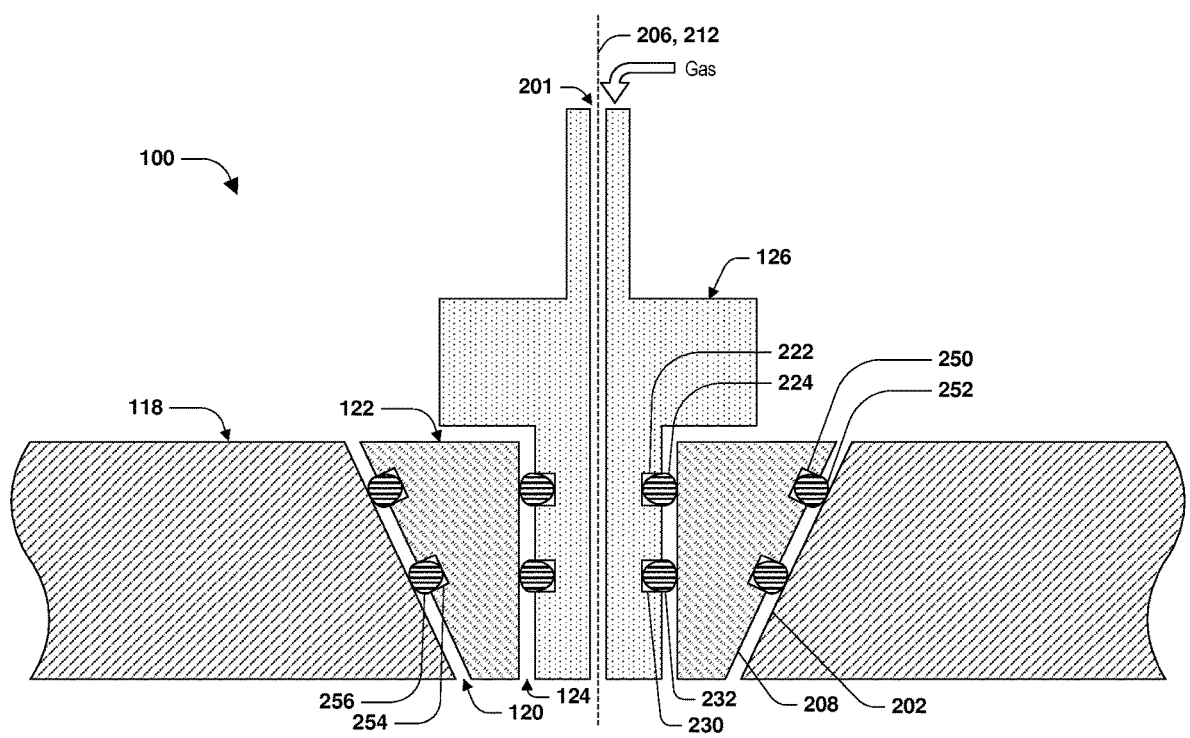
Figure 2J:
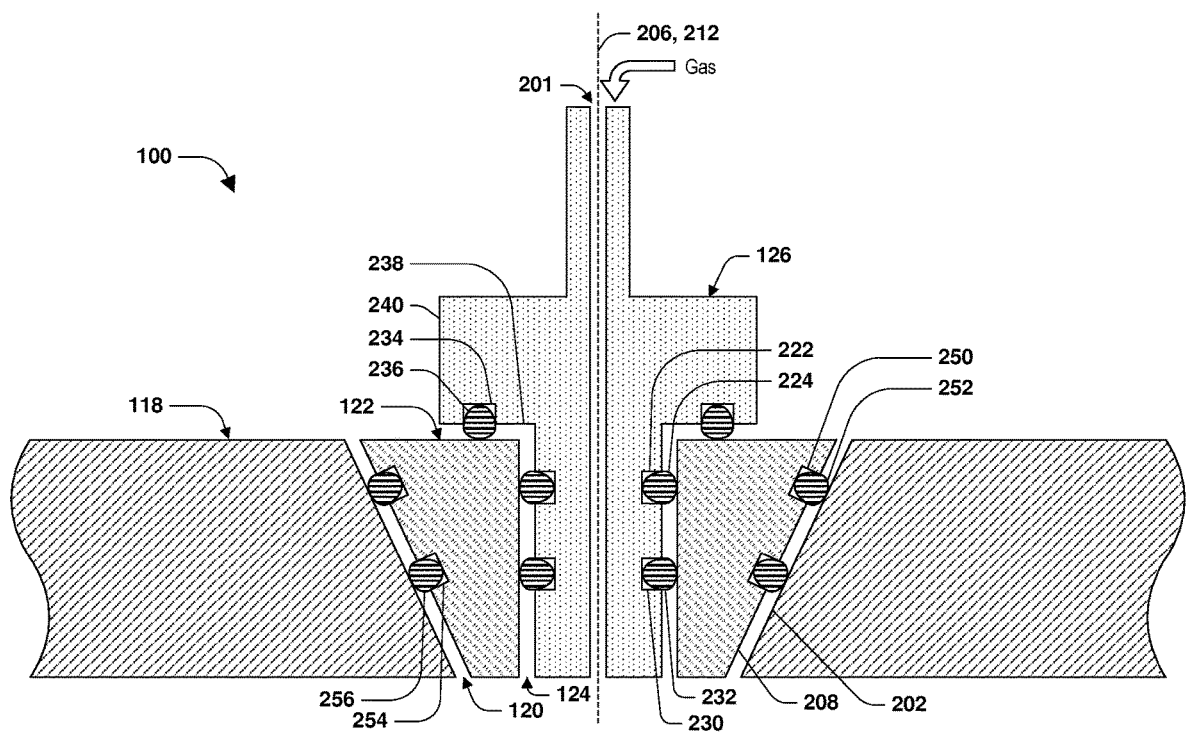
Figure 2K:
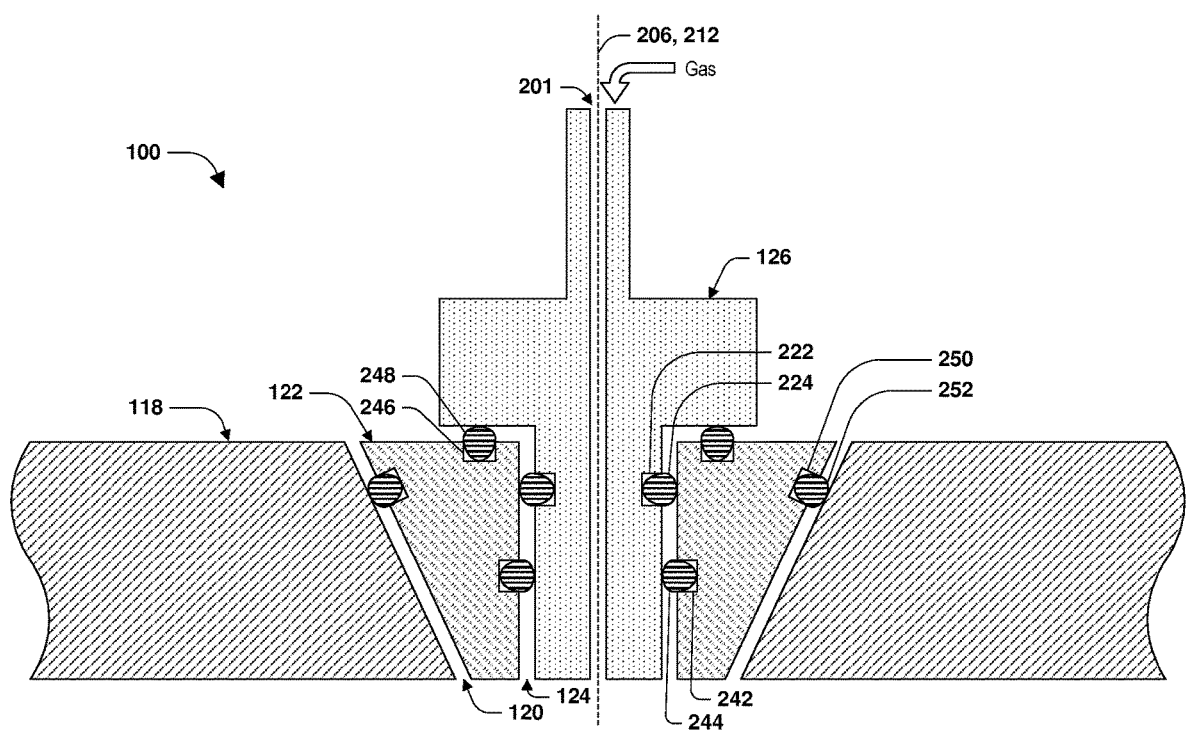
Figure 2L:
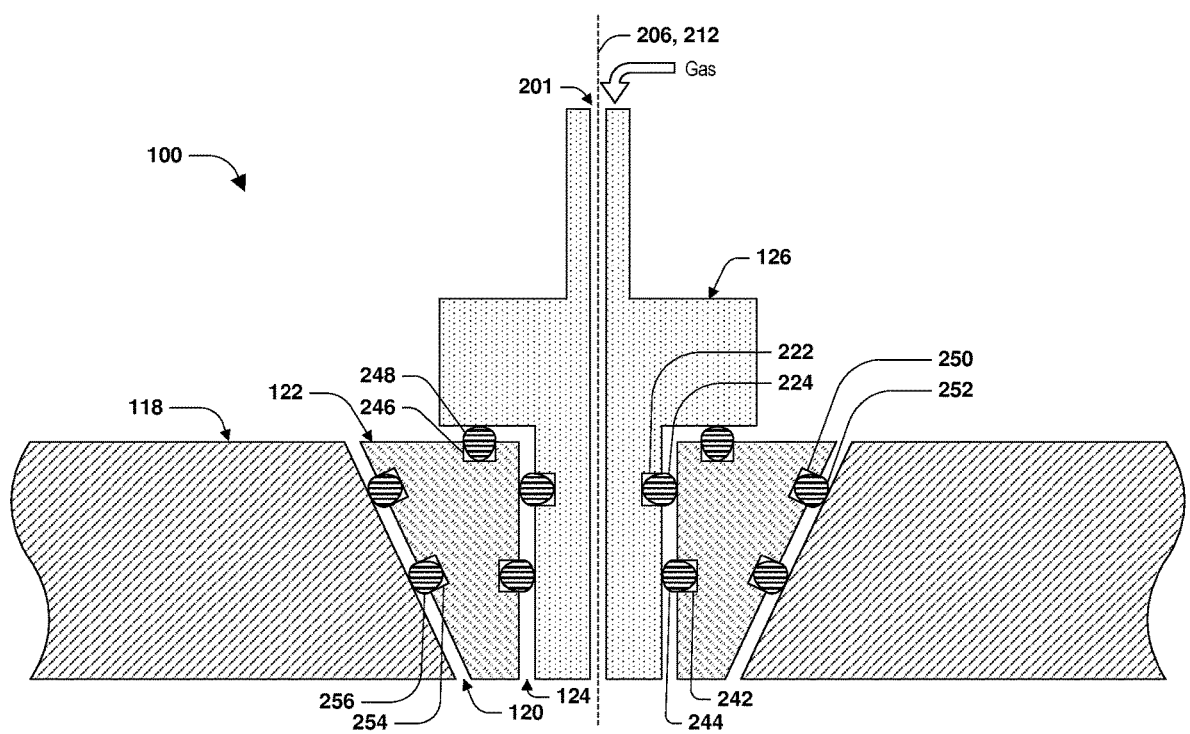
Figure 2M:
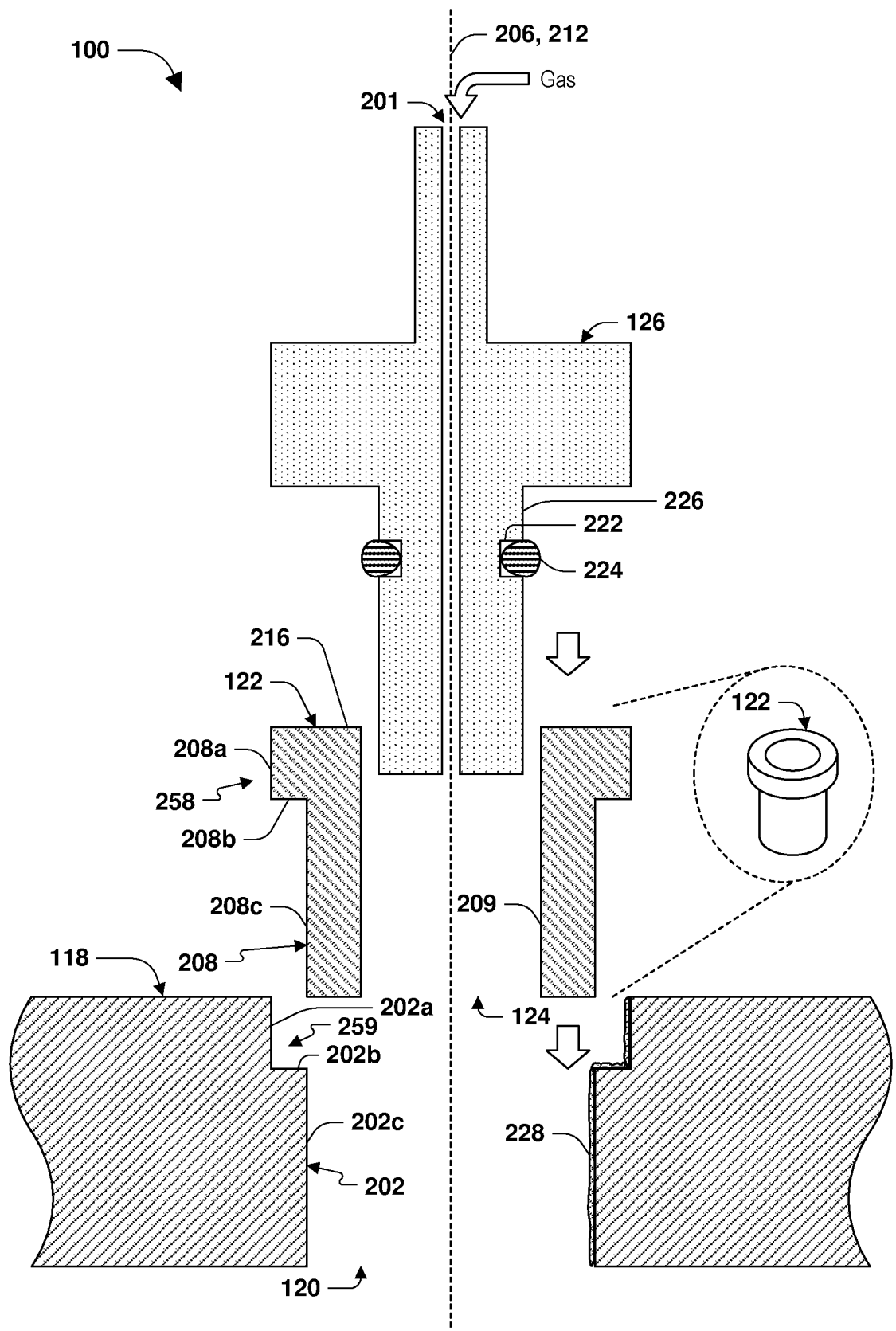
Figure 2N:
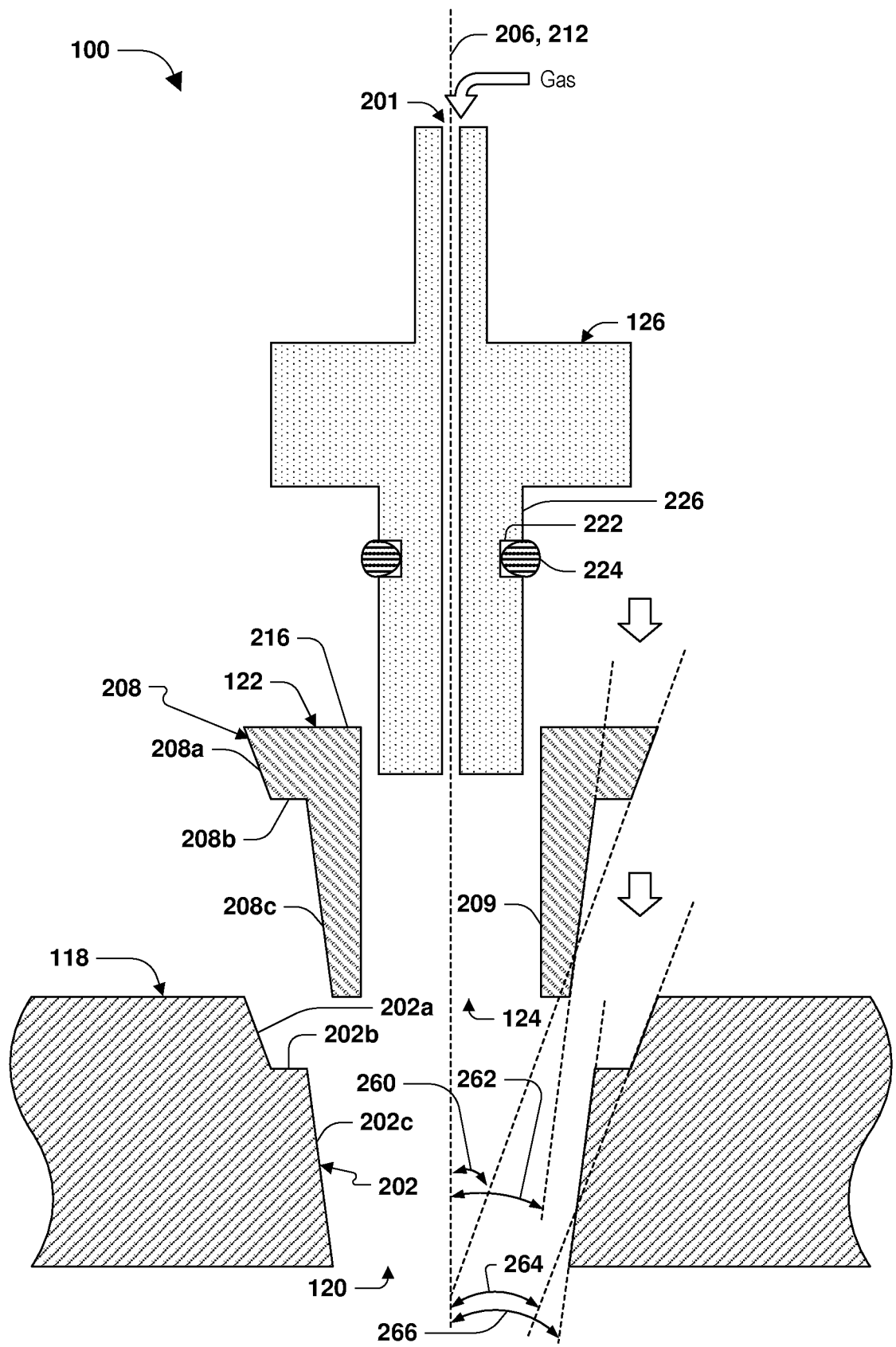

FIGS. 2A-2N are schematic illustrations of at least some of the plasma processing apparatus 100, according to some embodiments. FIG. 2A is an exploded sectional view of the plasma processing apparatus 100 illustrating, among other things, the injector holder 118, the sleeve 122, and the gas injector 126, according to some embodiments. The sleeve 122 is configured to be received within the opening 120 of the injector holder 118. The sleeve 122 defines the opening 124. The gas injector 126 is configured to be received within the opening 124 of the sleeve 122. The gas injector 126 defines a channel 201 to transmit gas from the gas supply 130 into the interior chamber 106 of the plasma processing apparatus 100. The injector holder 118 comprises a side surface 202 forming an acute angle 204 with a vertical axis 206 of the injector holder 118. The sleeve 122 comprises a side surface 208 forming an acute angle 210 with a vertical axis 212 of the sleeve 122. As illustrated, the sleeve 122 is disposed above and/or centered with respect to the injector holder 118 such that the vertical axis 212 of the sleeve 122 is represented by the same dashed line as the vertical axis 206 of the injector holder 118. The sleeve 122 comprises a side surface 209 to define the opening 124 for receiving the gas injector 126. According to some embodiments, the side surface 209 is generally parallel to the vertical axis 212 of the sleeve 122. Other arrangements and/or configurations of the injector holder 118, the sleeve 122, and/or the gas injector 126 are within the scope of the present disclosure.

According to some embodiments, the acute angle 204 of the side surface 202 of the injector holder 118 is between 30 and 60 degrees. In some embodiments, the acute angle 204 is between 40 and 50 degrees. In some embodiments, the acute angle 204 is about 45 degrees. Other shape(s) and/or angle(s) of the acute angle 204 are within the scope of the present disclosure. In some embodiments, the acute angle 210 of the side surface 208 of the sleeve 122 is between 30 and 60 degrees. In some embodiments, the acute angle 210 is between 40 and 50 degrees. In some embodiments, the acute angle 210 is about 45 degrees. Other shape(s) and/or angle(s) of the acute angle 210 are within the scope of the present disclosure. In some embodiments, the acute angle 204 of the side surface 202 of the injector holder 118 is coincident with the acute angle 210 of the side surface 208 of the sleeve 122 such that the side surface 202 mates, such as comes into flush contact, with the side surface 208. The opening 120 in the injector holder 118 is formed such that the opening 120 is defined by the side surface 202 that forms the acute angle 204 with the vertical axis 206 of the injector holder 118. The opening 124 is formed in the sleeve 122 to have the side surface 208 that forms the acute angle 210 with the vertical axis 212 of the sleeve 122 and/or that is coincident with the acute angle 204 such that the side surface 208 mates with the side surface 202.

According to some embodiments, the gas injector 126 is mechanically pressed into the injector holder 118 by way of a mechanical structure (not shown in FIG. 2A), as illustrated by arrows 211. The side surface 208 of the sleeve 122 mates with the side surface 202 of the injector holder 118 and inhibits vertical and/or horizontal movement of the sleeve 122. The provision of the acute angle 204 of the side surface 202 of the injector holder 118 and/or the acute angle 210 of the side surface 208 of the sleeve 122, as set forth above, seeks to restrain movement of the sleeve 122 into the interior chamber 106 of the plasma processing apparatus. During repeated processing by the plasma processing apparatus 100, an interior side surface 214 of the injector holder 118 may become corroded and/or deteriorated more than and/or at a faster rate than the sleeve 122, such as due to the relative sensitivities of the different material compositions of the injector holder 118 and the sleeve 122 to a plasma, for example, generated in the interior chamber 10. The side surface 208 of the sleeve 122 extends diagonally, at an angle, has a tapered, profile, etc. such that the side surface 208 extends both horizontally and vertically. The amount of surface area provided by the side surface 208 of the sleeve 122 corresponds to a length Ls1 of the side surface 208. According to some embodiments, the length Ls1 is greater than a horizontal width Ws1 of an exterior side surface 216 of the sleeve 122. According to some embodiments, the length Ls1 is greater than a horizontal width Ws2 of an interior side surface 218 of the sleeve 122. According to some embodiments, an interior portion of the injector holder 118 about the opening 120 in the injector holder 120 has a dimension Wih1 corresponding to a horizontal difference between an outer diameter of the interior side surface 218 of the sleeve 122 and an outer diameter of the exterior side surface 216 of the sleeve 122. According to some embodiments, if an interior portion of the injector holder 118 about the opening 120 of the injector holder 118 becomes deteriorated, the surface area provided by the side surface 208 of the sleeve 122 provides greater contact area to mitigate emission of plasma between the injector holder 118 and the sleeve 122. Other arrangements and/or configurations of the acute angle 204 of the side surface 202 of the injector holder 118 and/or the acute angle 210 of the side surface 208 of the sleeve 122 are within the scope of the present disclosure.

According to some embodiments, the gas injector 126 defines a groove 222 about a lower outer periphery, which is configured to receive an O-ring 224. The O-ring 224 is a fixing feature to provide a seal between the gas injector 126 and the sleeve 122. As illustrated, the groove 222 is defined in a side surface 226 about an exterior lower portion of the gas injector 126. The O-ring 224, or other O-rings, may include a fluorocarbon-based fluoroelastomer material, such as fluoro-rubber (FKM), or a perfluoroelastomer material, such as perfluoroelastomer-rubber (FFKM). FKM is an ASTM International (ASTM) standard designation D1418 for a class of fluorinated, carbon-based synthetic rubber, commonly known as fluoroelastomer. FKM is also known by the fluoroelastomer category (FPM) according to the International Organization for Standardization (ISO) standard designation ISO 1629, and is also known as fluorine rubber. FKM contains vinylidene fluoride as a monomer. FKM provides heat resistance for seals in temperatures greater than 200° C. and provides resistance to high pressures, chemicals and/or other fluids. FFKM is designated by ASTM as standard 1418. FFKM materials contain a higher amount of fluorine than FKM fluoroelastomers. FFKM materials may provide resistance to plasma environments in higher service temperature conditions. FFKM materials provide resistance to contact with hydrocarbons or highly corrosive fluids, or plasmas over a range of temperatures from ambient temperature to over 320° C. According to some embodiments, the O-ring 224, or other O-rings, include one or more other materials such as silicone, vinyl-methyl-silicone (VMQ), nitrile butadiene rubber (NBR), polytetrafluoroethylene (PTFE), fluorosilicone rubber (FVMQ), and/or silicone rubber. According to some embodiments, the O-ring 224, or other O-rings, may be changed depending upon the type of processing and/or the type of material used in the plasma processing apparatus 100. Other materials and/or configurations for the O-ring 224 and/or other O-rings are within the scope of the present disclosure.

FIG. 2B is a sectional view of at least some of the plasma processing apparatus 100, according to some embodiments. FIG. 2B illustrates, among other things, the injector holder 118, the sleeve 122, and the gas injector 126 in an assembled configuration. The sleeve 122 is received within the opening 120 of the injector holder 118 and/or the gas injector 126 is received within the opening 124 of the sleeve 122. The sleeve 122 is adhered to the injector holder 118 with a bonding material 228, such as an adhesive. The bonding material 228 is exaggerated in FIG. 2B for clarity. The bonding material 228 bonds at least some of the side surface 208 of the sleeve 122 to at least some of the side surface 202 of the injector holder 118.

According to some embodiments, the bonding material 228 between the sleeve 122 and the injector holder 118 may include an adhesive, such as a single component epoxy adhesive or a dual component epoxy adhesive. The bonding material 228 may include a structural adhesive, such as a structural acrylic adhesive, an epoxy, and/or a combination of a structural adhesive and an epoxy. The bonding material 228 may include another adhesive component, such as an anaerobic adhesive, a cyanoacrylate adhesive (e.g., methyl cyanoacrylate), or a modified structural polymer adhesive. According to some embodiments, the bonding material 228 may be used in combination with an activator, such as an anaerobic surface activator. Other arrangements and/or configurations of the bonding material 228 are within the scope of the present disclosure.

FIG. 2C is a sectional view of at least some of the plasma processing apparatus 100, according to some embodiments. FIG. 2C illustrates an embodiment with the sleeve 122 adhered to the injector holder 118 with the bonding material 228. The gas injector 126 defines a second groove 230, which is configured to receive a second O-ring 232. The second O-ring 232 is a fixing feature to provide a seal between the gas injector 126 and the sleeve 122. As illustrated, the groove 222 is defined in the side surface 226 about an exterior lower portion of the gas injector 126. According to some embodiments, the groove 222 and the second groove 230 are evenly spaced within the side surface 226 between a top surface and a bottom surface of the injector holder 118. According to some embodiments, the second groove 230 has the same dimensions as the groove 222, and the second O-ring 232 is composed of the same material as the O-ring 224. According to an embodiment the second groove 230 and the second O-ring 232 in combination with the groove 222 and the O-ring 224 mitigate penetration of reactive plasma gas into the opening 124 of the sleeve 122 than a single O-ring. According to some embodiments, the second groove 230 has different dimensions than the groove 222, such as set forth below with reference to FIGS. 3A-3D. For example, the second groove 230 may have a larger dimension than the groove 222 such that the second groove 230 may receive a second O-ring 232 with a larger diameter and/or shape than the O-ring 224. A larger diameter for the second O-ring 232 may mitigate penetration of reactive plasma gas within the opening 124 of the sleeve 122. Other arrangements and/or configurations of the groove 222, the O-ring 224, the second groove 230, and/or the second O-ring 232 are within the scope of the present disclosure.

FIG. 2D is a sectional view of at least some of the plasma processing apparatus 100, according to some embodiments. FIG. 2D illustrates an embodiment with the sleeve 122 adhered to the injector holder 118 with the bonding material 228. The gas injector 126 defines a third groove 234, which is configured to receive a third O-ring 236. The third O-ring 236 is a fixing feature to provide a seal between the gas injector 126 and the sleeve 122. As illustrated, the third groove 234 is defined in a sidewall 238 of a flange 240 of the gas injector 126. The third O-ring 236 flexibly deforms to provide a fixing feature between the gas injector 126 and the sleeve 122. According to some embodiments, the third groove 234 has the same dimensions as the groove 222, and the third O-ring 236 is composed of the same material as the O-ring 224. According to some embodiments, the third groove 234 and the third O-ring 236 in combination with the second groove 230, the second O-ring 232, the groove 222, and the O-ring 224 provides greater resistance to penetration of reactive plasma gas than a single or dual O-ring configuration. According to some embodiments, the third groove 234 has different dimensions than the groove 222, such as set forth below with reference to FIGS. 3A-3D. For example, the third groove 234 may have a smaller dimension than the groove 222. A smaller diameter for the third O-ring 236 may offer more uniform placement of the gas injector 126 with respect to the sleeve 122. Other arrangements and/or configurations of the groove 222, the O-ring 224, the second groove 230, the second O-ring 232, the third groove 234, and/or the third O-ring 236 are within the scope of the present disclosure.

FIG. 2E is a sectional view of at least some of the plasma processing apparatus 100, according to some embodiments. FIG. 2E illustrates an embodiment with the sleeve 122 adhered to the injector holder 118 with the bonding material 228. The gas injector 126 defines the groove 222 about a lower outer periphery, which is configured to receive the O-ring 224. The O-ring 224 is a fixing feature to provide a seal between the gas injector 126 and the sleeve 122. The sleeve 122 defines a fourth groove 242, which is configured to receive a fourth O-ring 244. The fourth O-ring 244 is a fixing feature to provide a seal between the gas injector 126 and the sleeve 122. As illustrated, the fourth groove 242 is defined in the side surface 209 of the sleeve 122. The fourth O-ring 244 flexibly deforms to provide a fixing feature between the gas injector 126 and the sleeve 122. According to some embodiments, the fourth groove 242 has the same dimensions as the groove 222, and the fourth O-ring 244 is composed of the same material as the O-ring 224. According to some embodiments, the fourth groove 242 has different dimensions from the groove 222, such as set forth below with reference to FIGS. 3A-3D. For example, the fourth groove 242 may have a larger dimension than the groove 222. A larger diameter for the fourth O-ring 244 may offer greater resistance to penetration of reactive plasma gas within the opening 124 in the sleeve 122. By providing the fourth groove 242 within the sleeve 122, two O-rings may provide a greater seal for the gas injector 126 than is provided with a single groove and a single O-ring, without modification of the gas injector. Other arrangements and/or configurations of the fourth groove 242 and/or the fourth O-ring 244 are within the scope of the present disclosure.

FIG. 2F is a sectional view of at least some of the plasma processing apparatus 100, according to some embodiments. FIG. 2F illustrates an embodiment with the sleeve 122 adhered to the injector holder 118 with the bonding material 228. The gas injector 126 defines the groove 222 about a lower outer periphery, which is configured to receive the O-ring 224. The O-ring 224 is a fixing feature to provide a seal between the gas injector 126 and the sleeve 122. The sleeve 122 defines a fifth groove 246, which is configured to receive a fifth O-ring 248. The fifth O-ring 248 is a fixing feature to provide a seal between the gas injector 126 and the sleeve 122. As illustrated, the fifth groove 246 is defined in the exterior side surface 216 of the sleeve 122. The fifth O-ring flexibly deforms to provide a fixing feature between the gas injector 126 and the sleeve 122. According to some embodiments, by providing the fourth groove 242 and the fifth groove 246 within the sleeve 122, three O-rings may seal the gas injector 126 to the sleeve 122 without modification of the gas injector. Other arrangements and/or configurations of the fifth groove 246, the fourth groove 242, the fifth O-ring 248, and/or the fourth O-ring 244 are within the scope of the present disclosure.

FIG. 2G is a sectional view of at least some of the plasma processing apparatus 100, according to some embodiments. FIG. 2G illustrates an embodiment with the sleeve 122 sealed to the injector holder 118 with a sixth groove 250 and a sixth O-ring 252. The gas injector 126 defines the groove 222 about a lower outer periphery, which is configured to receive the O-ring 224. The O-ring 224 is a fixing feature to provide a seal between the gas injector 126 and the sleeve 122. The sleeve 122 defines the sixth groove 250 about the side surface 208 of the sleeve 122, which is configured to receive the sixth O-ring 252. The sixth O-ring 252 is a fixing feature to provide a seal between the sleeve 122 and the injector holder 118. The sixth O-ring flexibly deforms to provide a fixing feature between the sleeve 122 and the injector holder 118. According to some embodiments, by providing the sixth groove 250 within the side surface 208 of the sleeve 122, the sleeve 122 may be removably received within the opening 120 of the injector holder 118. Other arrangements and/or configurations of the sixth groove 250 and/or the sixth O-ring 252 are within the scope of the present disclosure.

FIG. 2H is a sectional view of at least some of the plasma processing apparatus 100, according to some embodiments. FIG. 2H illustrates an embodiment with the sleeve 122 sealed to the injector holder 118 with the sixth groove 250 configured to receive the sixth O-ring 252, and a seventh groove 254 configured to receive a seventh O-ring 256. The gas injector 126 defines the groove 222 about a lower outer periphery, which is configured to receive the O-ring 224. The O-ring 224 is a fixing feature to provide a seal between the gas injector 126 and the sleeve 122. The sixth O-ring 252 and the seventh O-ring 256 are fixing features to provide a seal between the sleeve 122 and the injector holder 118. According to some embodiments, by providing the seventh groove 254 within the side surface 208 of the sleeve 122, the sleeve 122 may be removably received within the opening 120 of the injector holder 118. According to some embodiments, a combination of the sixth O-ring 252 and the seventh O-ring 256 may provide increased resistance to penetration of reactive plasma gas through the opening 120 in the injector holder 118 or the opening 124 of the sleeve 122 than a configuration with a single O-ring. Other arrangements and/or configurations of the sixth groove 250, the sixth O-ring 252, the seventh groove 254, and/or the seventh O-ring 256 are within the scope of the present disclosure.

FIG. 2I is a sectional view of at least some of the plasma processing apparatus 100, according to some embodiments. FIG. 2I illustrates an embodiment with the sleeve 122 sealed to the injector holder 118 with the sixth O-ring 252 and the seventh O-ring 256. The gas injector 126 is sealed to the sleeve 122 with the O-ring 224 and the second O-ring 232. According to some embodiments, the sleeve 122 may be removably retained within the opening 120 by providing the seventh groove 254 within the side surface 208 of the sleeve 122, the sleeve 122 may be removably retained within the opening 120 of the injector holder 118 and the gas injector 126 may be removably retained within the opening 124 of the sleeve 122. According to some embodiments, a combination of the O-ring 224, the second O-ring 232, the sixth O-ring 252, and the seventh O-ring 256 may provide increased resistance to penetration of reactive plasma gas through the opening 120 in the injector holder 118 and/or the opening 124 in the sleeve 122 than a configuration with one, two, or three O-rings. Other arrangements and/or configurations of the O-ring 224, the second O-ring 232, the sixth O-ring 252, and/or the seventh O-ring 256 are within the scope of the present disclosure.

FIG. 2J is a sectional view of at least some of the plasma processing apparatus 100, according to some embodiments. FIG. 2J illustrates an embodiment with the sleeve 122 sealed to the injector holder 118 with the sixth O-ring 252 and the seventh O-ring 256. The gas injector 126 is sealed to the sleeve 122 with the O-ring 224, the second O-ring 232, and the third O-ring 236. According to some embodiments, the sleeve 122 may be removably retained within the opening 120 of the injector holder 118 and the gas injector 126 may be removably retained within the opening 124 of the sleeve 122. According to some embodiments, a combination of the O-ring 224, the second O-ring 232, the third O-ring 236, the sixth O-ring 252, and the seventh O-ring 256 may provide increased resistance to penetration of reactive plasma gas through the opening 120 in the injector holder 118 and/or the opening 124 of the sleeve 122 than a configuration with one, two, three, or four O-rings. Other arrangements and/or configurations of the O-ring 224, the second O-ring 232, the third O-ring 236, the sixth O-ring 252, and/or the seventh O-ring 256 are within the scope of the present disclosure.

FIG. 2K is a sectional view of at least some of the plasma processing apparatus 100, according to some embodiments. FIG. 2K illustrates an embodiment with the sleeve 122 sealed to the injector holder 118 with the sixth O-ring 252 and the seventh O-ring 256. The gas injector 126 is sealed to the sleeve 122 with the O-ring 224, the fourth O-ring 244, and the fifth O-ring 248. According to some embodiments, the sleeve 122 may be removably retained within the opening 120 of the injector holder 118 and the gas injector 126 may be removably retained within the opening 124 of the sleeve 122. According to some embodiments, a combination of the O-ring 224, the fourth O-ring 244, and the fifth O-ring 248 may provide increased resistance to penetration of reactive plasma gas through the opening 124 of the sleeve 122 than a configuration with one or two O-rings. According to some embodiments, by providing the fourth groove 242 and the fifth groove 246 within the sleeve 122, three O-rings may seal the gas injector 126 to the sleeve 122, without modification of the gas injector. Other arrangements and/or configurations of the O-ring 224, the fourth O-ring 244, and/or the fifth O-ring 248 are within the scope of the present disclosure.

FIG. 2L is a sectional view of at least some of the plasma processing apparatus 100, according to some embodiments. FIG. 2L illustrates an embodiment with the sleeve 122 sealed to the injector holder 118 with the sixth O-ring 252 and the seventh O-ring 256. The gas injector 126 is sealed to the sleeve 122 with the O-ring 224, the fourth O-ring 244, and the fifth O-ring 248. According to some embodiments, the sleeve 122 may be removably retained within the opening 120 of the injector holder 118 and the gas injector 126 may be removably retained within the opening 124 of the sleeve 122. According to some embodiments, a combination of the O-ring 224, the fourth O-ring 244, and the fifth O-ring 248 may provide increased resistance to penetration of reactive plasma gas through the opening 124 of the sleeve 122 than a configuration with one or two O-rings. According to some embodiments, a combination of the sixth O-ring 252 and the seventh O-ring 256 may provide increased resistance to penetration of reactive plasma gas through the opening 120 in the injector holder 118 than a configuration with one O-ring. According to some embodiments, by providing the fourth groove 242 and the fifth groove 246 within the sleeve 122, three O-rings may seal the gas injector 126 to the sleeve 122, without modification of the gas injector. Other arrangements and/or configurations of the O-ring 224, the fourth O-ring 244, the fifth O-ring 248, the sixth O-ring 252, and/or the seventh O-ring 256 are within the scope of the present disclosure.

FIG. 2M is an exploded sectional view of the plasma processing apparatus 100, according to some embodiments. As illustrated in FIG. 2M, the sleeve 122 is configured to be received within the opening 120 of the injector holder 118. The sleeve 122 defines the opening 124. The gas injector 126 is configured to be received within the opening 124 of the sleeve 122. The gas injector 126 defines the channel 201 to transmit gas from the gas supply 130 into the interior chamber 106 of the plasma processing apparatus 100. The sleeve 122 comprises the side surface 209 to define the opening 124 for receiving the gas injector 126. In some embodiments, the sleeve 122 is disposed above and/or centered with respect to the injector holder 118 such that the vertical axis 212 of the sleeve 122 is represented by the same dashed line as the vertical axis 206 of the injector holder 118. In some embodiments, the injector holder 118 comprises the side surface 202, which is an injector holder side surface. The side surface 202 includes a first side surface 202a, a second side surface 202b contiguous with the first side surface 202a, and a third side surface 203c contiguous with the second side surface 202b. In some embodiments, the sleeve 122 comprises the side surface 208, which is a sleeve side surface. The side surface 208 includes a first side surface 208a, a second side surface 208b contiguous with the first side surface 208a, and a third side surface 208c contiguous with the second side surface 208b. In some embodiments, the side surface 208 of the sleeve 122 is configured to mate with the side surface 202 of the injector holder 118. For example, the first side surface 208a may mate with the first side surface 202a, the second side surface 208b may mate with the second side surface 202b, and/or the third side surface 208c may mate with the third side surface 202c. In some embodiments, the first side surface 208a and the second side surface 208b of the sleeve 122 define an annular ridge 258. In some embodiments, the first side surface 202a and the second side surface 202b of the injector holder 118 define an annular recess 259. In some embodiments, the annular recess 259 is configured to receive the annular ridge 258 and/or fixedly retain the sleeve 122 within the opening 120. In some embodiments, the injector holder 118 comprises the first side surface 202a forming a first acute angle with the vertical axis 206 of the injector holder 118. For example, the first side surface 202a may be substantially parallel to the vertical axis 206 such that the first acute angle is substantially zero degrees. In some embodiments, the sleeve 122 comprises the first side surface 208a forming a second acute angle with the vertical axis 212 of the sleeve 122. For example, the first side surface 208a may be substantially parallel to the vertical axis 212 such that the second acute angle is substantially zero degrees. In some embodiments, the first acute angle is coincident with the second acute angle such that the first side surface 202a mates with the first side surface 208a. In some embodiments, the side surface 208 of the sleeve 122 is affixed to the side surface 202 of the injector holder 118 with a bonding material and/or one or more O-rings, such as set forth above, for example, with reference to FIGS. 2A-2L. In some embodiments, the side surface 209 of the sleeve 122 is affixed to the side surface 226 of the gas injector 126 with a bonding material and/or one or more O-rings, such as set forth above, for example, with reference to FIGS. 2A-2L.

According to some embodiments, the bonding material 228 is applied between the side surface 202 of the injector holder 118 and the side surface 208 of the sleeve 122. For example, the bonding material 228 may be applied to one or more of the first side surface 202a, the second side surface 202b, or the third side surface 202c to secure the sleeve 122 within the injector holder 118. In another example, the bonding material 228 may be applied to one or more of the first side surface 208a, the second side surface 208b, or the third side surface 208c to secure the sleeve 122 within the injector holder 118. In another example, the bonding material 228 may be applied to two mating side surfaces, such as one or more of the first side surface 208a and the first side surface 202a, the second side surface 208b and the second side surface 202b, or the third side surface 208c and the third side surface 202c to secure the sleeve 122 within the injector holder 118. In some embodiments, the bonding material 228 is substituted with one or more O-rings, such as the sixth O-ring 252 and/or the seventh O-ring 256 set forth above with reference to FIGS. 2G-2L. Other arrangements and/or configurations of the injector holder 118, the sleeve 122, the gas injector 126, the side surface 208 of the sleeve 122, and/or the side surface 202 of the injector holder 118 are within the scope of the present disclosure.

FIG. 2N is an exploded sectional view of the plasma processing apparatus 100, according to some embodiments. As illustrated in FIG. 2N, the sleeve 122 is configured to be received within the opening 120 of the injector holder 118. The sleeve 122 defines the opening 124. The gas injector 126 is configured to be received within the opening 124 of the sleeve 122. The gas injector 126 defines the channel 201 to transmit gas from the gas supply 130 into the interior chamber 106 of the plasma processing apparatus 100. The sleeve 122 comprises the side surface 209 to define the opening 124 for receiving the gas injector 126. In some embodiments, the sleeve 122 is disposed above and/or centered with respect to the injector holder 118 such that the vertical axis 212 of the sleeve 122 is represented by the same dashed line as the vertical axis 206 of the injector holder 118. In some embodiments, the injector holder 118 comprises the side surface 202, including the first side surface 202a, the second side surface 202b, and the third side surface 203c. In some embodiments, the sleeve 122 comprises the side surface 208, including the first side surface 208a, the second side surface 208b, and the third side surface 208c. In some embodiments, the side surface 208 of the sleeve 122 is configured to mate with the side surface 202 of the injector holder. In some embodiments, the side surface 208 of the sleeve 122 is affixed to the side surface 202 of the injector holder 118 with a bonding material and/or one or more O-rings, such as set forth above, for example, with reference to FIGS. 2A-2L. In some embodiments, the side surface 209 of the sleeve 122 is affixed to the side surface 226 of the gas injector 126 with a bonding material and/or one or more O-rings, such as set forth above, for example, with reference to FIGS. 2A-2L.

According to some embodiments, the first side surface 208a of the sleeve 122 is angled and/or forms an acute angle 260 with the vertical axis 212 of the sleeve 122. In some embodiments, the acute angle 260 of the first side surface 208a of the sleeve 122 is between 30 and 60 degrees. In some embodiments, the acute angle 260 is between 40 and 50 degrees. In some embodiments, the acute angle 260 is greater than 45 degrees such that a complementary angle with respect to a horizontal axis of the sleeve 122 is less than 45 degrees. In some embodiments, the acute angle 260 is about 45 degrees.

According to some embodiments, the third side surface 208c of the sleeve 122 is angled and/or forms an acute angle 262 with the vertical axis 212 of the sleeve 122. In some embodiments, the acute angle 262 of the third side surface 208c of the sleeve 122 is between 30 and 60 degrees. In some embodiments, the acute angle 262 is between 40 and 50 degrees. In some embodiments, the acute angle 262 is greater than 45 degrees such that a complementary angle with respect to the horizontal axis of the sleeve 122 is less than 45 degrees. In some embodiments, the acute angle 262 is about 45 degrees. In some embodiments, the acute angle 262 is different from the acute angle 260, such as less than or greater than the acute angle 260. In some embodiments, the acute angle 262 is substantially equal to the acute angle 260.

According to some embodiments, the first side surface 202a of the injector holder 118 is angled and/or forms an acute angle 264 with the vertical axis 206 of the injector holder 118. In some embodiments, the acute angle 264 of the first side surface 202a of the injector holder 118 is between 30 and 60 degrees. In some embodiments, the acute angle 264 is between 40 and 50 degrees. In some embodiments, the acute angle 264 is greater than 45 degrees such that a complementary angle with respect to a horizontal axis of the injector holder 118 is less than 45 degrees. In some embodiments, the acute angle 264 is about 45 degrees. In some embodiments, the acute angle 264 of the first side surface 202a of the injector holder 118 is slightly less than the acute angle 260 of the first side surface 208a of the sleeve 122, such as less than 1 degree. In some embodiments, the acute angle 264 of the first side surface 202a of the injector holder 118 is substantially equal to the acute angle 260 of the first side surface 208a of the sleeve 122.

According to some embodiments, the third side surface 202c of the injector holder 118 is angled and/or forms an acute angle 266 with the vertical axis 206 of the injector holder 118. In some embodiments, the acute angle 266 of the third side surface 202c of the injector holder 118 is between 30 and 60 degrees. In some embodiments, the acute angle 266 is between 40 and 50 degrees. In some embodiments, the acute angle 266 is greater than 45 degrees such that a complementary angle with respect to the horizontal axis of the injector holder 118 is less than 45 degrees. In some embodiments, the acute angle 266 is about 45 degrees. In some embodiments, the acute angle 266 of the third side surface 202c of the injector holder 118 is slightly less than the acute angle 262 of the third side surface 208c of the sleeve 122, such as less than 1 degree. In some embodiments, the acute angle 266 of the third side surface 202c of the injector holder 118 is substantially equal to the acute angle 262 of the third side surface 208c of sleeve 122. In some embodiments, the acute angle 266 of the third side surface 202c of the injector holder 118 is different from the acute angle 264 of the first side surface 202a of the injector holder 188, such as less than or greater than the acute angle 264. In some embodiments, the acute angle 266 is substantially equal to the acute angle 264. Other arrangements and/or configurations of the injector holder 118, the sleeve 122, the gas injector 126, the side surface 208 of the sleeve 122, and/or the side surface 202 of the injector holder 118 are within the scope of the present disclosure.

According to some embodiments, any number of fixing features, such as one or more O-rings and/or one or more bonding materials, such as one or more instances of one or more adhesives, layers of glue, etc., are between the injector holder 118 and the sleeve 122. According to some embodiments, any number of fixing features, such as one or more O-rings and/or one or more bonding materials, such as one or more instances of one or more adhesives, layers of glue, etc., are between the sleeve 122 and the gas injector 126. According to some embodiments, a fixing feature between the injector holder 118 and the sleeve 122 is different than another fixing feature between the injector holder 118 and the sleeve 122, such as in at least one of size, shape, composition, etc. According to some embodiments, a fixing feature between the sleeve 122 and the gas injector 126 is different than another fixing feature between the sleeve 122 and the gas injector 126, such as in at least one of size, shape, composition, etc. According to some embodiments, a fixing feature between the injector holder 118 and the sleeve 122 is different than another fixing feature between the sleeve 122 and the gas injector 126, such as in at least one of size, shape, composition, etc.

Figure 3A:
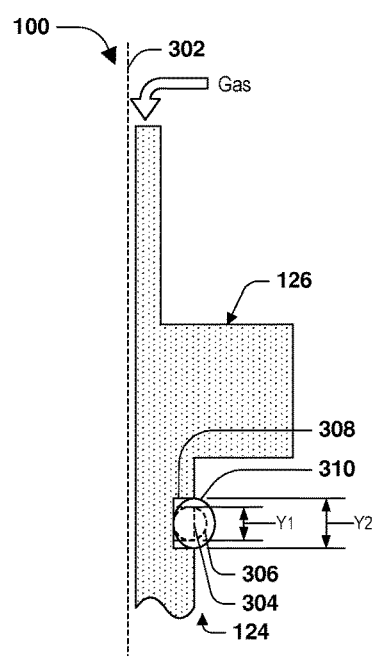
FIGS. 3A-3D are schematic illustrations of at least some of a plasma processing apparatus, such as an injector holder, a sleeve, and/or a gas injector of the plasma processing apparatus, according to some embodiments.

FIGS. 3A-3D are schematic illustrations of at least some of the plasma processing apparatus 100, according to some embodiments. FIG. 3A illustrates a partial section view of the gas injector 126 with respect to a vertical axis 302 of the gas injector 126. The gas injector 126 includes an original groove 304, which is configured to receive an original O-ring 306. The original groove 304 has an original vertical dimension Y1. The original groove 304 is changed, for example by computer numerical control (CNC) machining, to increase in the vertical dimension. The original groove 304 is changed to a new groove 308, which is configured to receive a new O-ring 310. The new groove 310 has a new vertical dimension Y2. According to some embodiments, the new vertical dimension Y2 is greater than the original vertical dimension Y1. According to some embodiments, the new vertical dimension Y2 is greater than the original vertical dimension Y1 in a range between 10 and 50% of the original vertical dimension Y1, such as between 20 and 30%. According to some embodiments, the new vertical dimension Y2 is greater than the original vertical dimension Y1 by about 25% of the original vertical dimension Y1. According to some embodiments, the new groove 308 and/or the new O-ring 310 may replace any of the grooves and/or O-rings set forth above. According to some embodiments, a change of the original groove 304 to the new groove 308 in the vertical dimension may mitigate penetration of reactive plasma gas within the opening 124 of the sleeve 122.

Figure 3B:
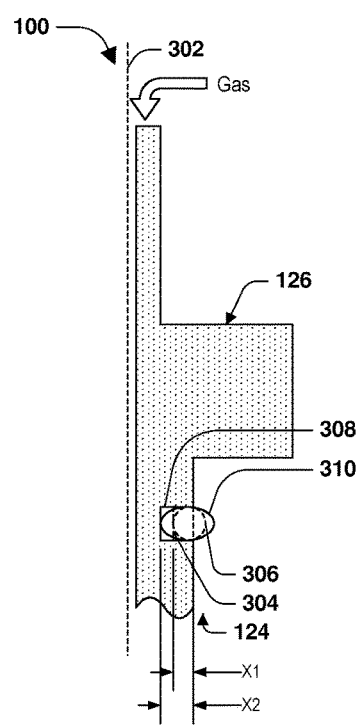

FIG. 3B is a sectional view of at least some of the plasma processing apparatus 100, according to some embodiments. FIG. 3B illustrates a partial section view of the gas injector 126 with respect to the vertical axis 302 of the gas injector 126. The gas injector 126 includes the original groove 304, which is configured to receive the original O-ring 306. The original groove 304 has an original horizontal dimension X1. The original groove 304 is changed, for example by CNC machining, to increase in the horizontal dimension. The original groove 304 is changed to the new groove 308, which is configured to receive the new O-ring 310. The new groove 310 has a new horizontal dimension X2. According to some embodiments, the new horizontal dimension X2 is greater than the original horizontal dimension X1. According to some embodiments, the new horizontal dimension X2 is greater than the original horizontal dimension X1 in a range between 10 and 50% of the original horizontal dimension X1, such as between 20 and 30%. According to some embodiments, the new horizontal dimension X2 is greater than the original horizontal dimension X1 by about 25% of the original horizontal dimension X1. According to some embodiments, the new groove 308 and/or the new O-ring 310 may replace any of the grooves and/or O-rings set forth above. According to some embodiments, a change of the original groove 304 to the new groove 308 in the horizontal dimension may mitigate penetration of reactive plasma gas within the opening 124 of the sleeve 122.

Figure 3C:
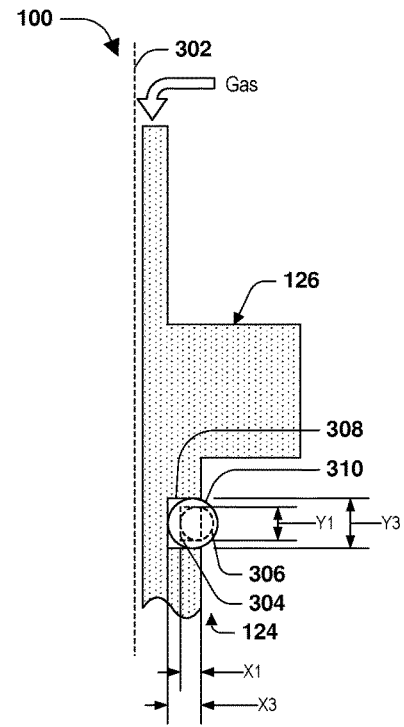

FIG. 3C is a sectional view of at least some of the plasma processing apparatus 100, according to some embodiments. FIG. 3C illustrates a partial section view of the gas injector 126 with respect to the vertical axis 302 of the gas injector 126. The gas injector 126 includes the original groove 304, which is configured to receive the original O-ring 306. The original groove 304 has the original horizontal dimension X1 and the original vertical dimension Y1. The original groove 304 is changed, for example by CNC machining, to increase in the horizontal dimension and the vertical dimension. The original groove 304 is changed to the new groove 308, which is configured to receive the new O-ring 310. The new groove 310 has a new horizontal dimension X3 and a new vertical dimension Y3. According to some embodiments, the new horizontal dimension X3 is greater than the original horizontal dimension X1 and the new vertical dimension Y3 is greater than the original vertical dimension Y1. According to some embodiments, the new horizontal dimension X3 is greater than the original horizontal dimension X1 in a range between 10 and 50% of the original horizontal dimension X1, such as between 20 and 30%. According to some embodiments, the new horizontal dimension X3 is greater than the original horizontal dimension X1 by about 25% of the original horizontal dimension X1. According to some embodiments, the new vertical dimension Y3 is greater than the original vertical dimension Y1 in a range between 10 and 50% of the original vertical dimension Y1, such as between 20 and 30%. According to some embodiments, the new vertical dimension Y3 is greater than the original vertical dimension Y1 by about 25% of the original vertical dimension Y1. According to some embodiments, the new groove 308 and the new O-ring 310 may replace any of the grooves and O-rings set forth above. According to some embodiments, a change of the original groove 304 to the new groove 308 in the horizontal dimension and the vertical dimension may mitigate penetration of reactive plasma gas within the opening 124 of the sleeve 122. Other arrangements and/or configurations of the new horizontal dimension X3 and/or the new vertical dimension Y3 are within the scope of the present disclosure.

Figure 3D:
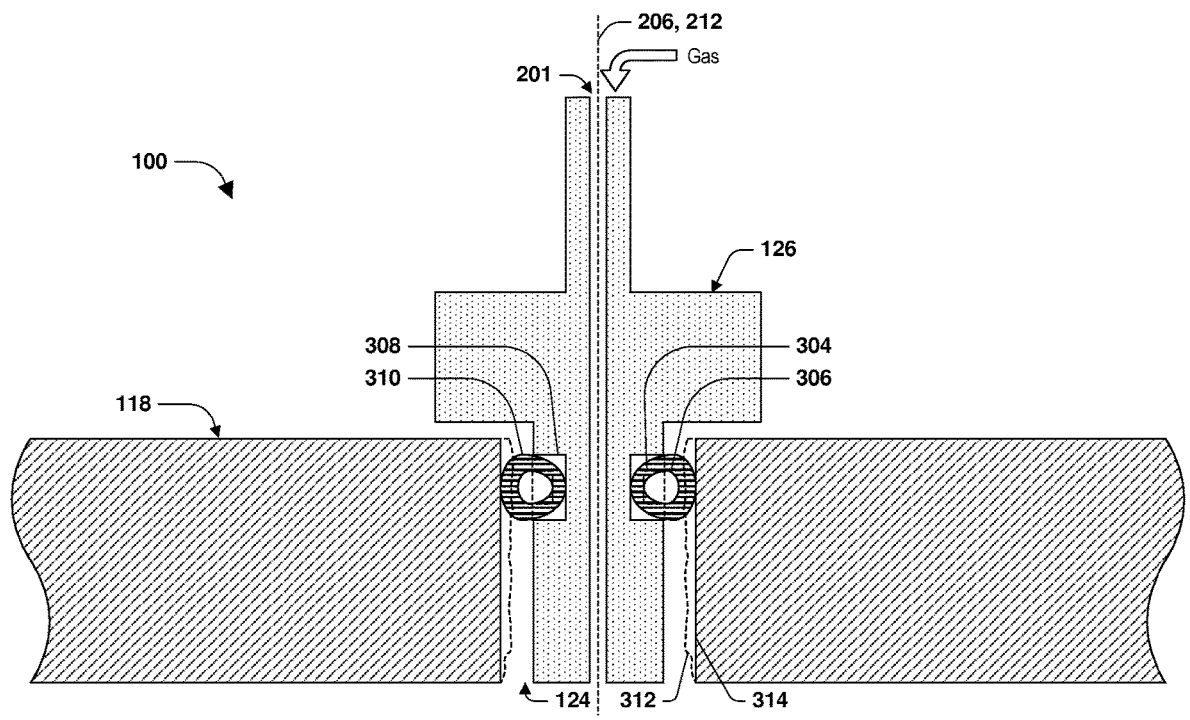

FIG. 3D is a sectional view of at least some of the plasma processing apparatus 100, according to some embodiments. FIG. 3D illustrates a partial section view of the gas injector 126 with respect to the vertical axis 302 of the gas injector 126. The gas injector 126 includes the original groove 304, which is configured to receive the original O-ring 306. The original groove 304 is changed, for example by CNC machining, to increase at least one of the horizontal dimension or the vertical dimension, as set forth above with reference to FIGS. 3A-3C. The original groove 304 is changed to the new groove 308, which is configured to receive the new O-ring 310. The injector holder 118 has an original side surface 312, which shows evidence of deterioration. The detreated original side surface 312 of the injector holder 118 has been changed, such as smoothed, for example by CNC machining, to a new side surface 314. According to some embodiments, the new groove 308 and the new O-ring 310 may replace any of the grooves and O-rings set forth above. According to some embodiments, a change of the original groove 304 to the new groove 308 in at least one of the horizontal dimension or the vertical dimension may mitigate penetration of reactive plasma gas within the opening 124 of the sleeve 122. Other arrangements and/or configurations of changing the original groove 304 and/or the original side surface 312 are within the scope of the present disclosure.

Figure 4A:
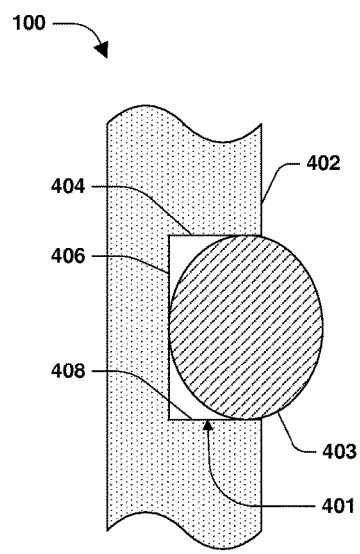
FIGS. 4A-4C are schematic illustrations of at least some of a plasma processing apparatus, such as an injector holder, a sleeve, and/or a gas injector of the plasma processing apparatus, according to some embodiments.
Figure 4B:
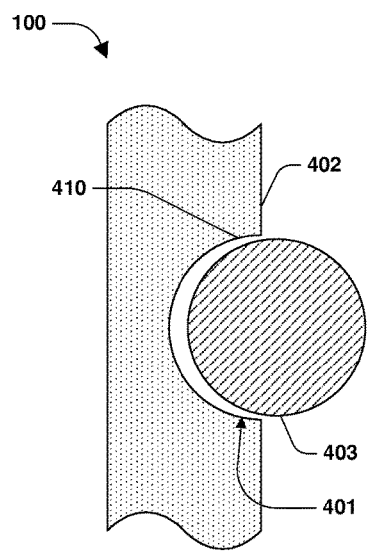
Figure 4C:
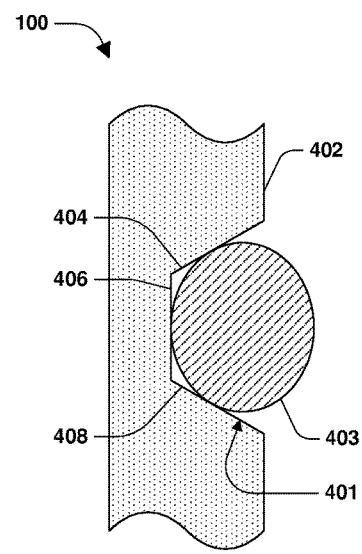

FIGS. 4A-4C are schematic illustrations of at least some of the plasma processing apparatus 100, according to some embodiments. FIG. 4A is an enhanced sectional view illustrating a groove 401 formed in a side surface 402. The groove 401 is configured to receive an O-ring 403. According to some embodiments, the side surface 402 corresponds to a side surface of at least one of the injector holder 118, the sleeve 122, or the gas injector 126. According to some embodiments, the groove 401 corresponds to any of the grooves set forth above. The groove 401 is a geometric shape, such as a rectangle or other regular geometric shape. The groove 401 includes a first groove side surface 404, a second groove side surface 406, and a third groove side surface 408. In some embodiments, the first groove side surface 404, the second groove side surface 406, and the third groove side surface 408 are configured to mate with and/or contact a side of the O-ring 403 when the O-ring 403 is received therein or flexibly deformed upon insertion into a receiving member, such as the injector holder 118 or the sleeve 122. According to some embodiments, the groove 401 is formed as a regular rectangle that provides increased surface contact of the O-ring 403 about the first groove side surface 404, the second groove side surface 406, and the third groove side surface 408 to mitigate penetration of reactive plasma gas between the side surface 402 and a side surface of an adjacent structural member.

FIG. 4B is an enhanced sectional view of at least some of the plasma processing apparatus 100, according to some embodiments. FIG. 4B illustrates the groove 401 formed in the side surface 402. The groove 401 is configured to receive the O-ring 403. According to some embodiments, the side surface 402 corresponds to a side surface of at least one of the injector holder 118, the sleeve 122, or the gas injector 126. According to some embodiments, the groove 401 corresponds to any of the grooves set forth above. The groove 401 is a curved geometric shape, such as a parabola, a partial circle, a partial ellipse, or other regular curved surface, and includes a side surface 410. In some embodiments, the side surface 410 is configured to mate with and/or contact a side of the O-ring 403 when the O-ring 403 is received therein or flexibly deformed upon contact with a receiving member, such as the injector holder 118 or the sleeve 122. According to some embodiments, the groove 401 is formed as a regular curved surface that provides increased surface contact of the O-ring 403 about the side surface 410 to provide increased resistance to penetration of reactive plasma gas between the side surface 402 and a side surface of an adjacent structural member.

FIG. 4C is an enhanced sectional view of at least some of the plasma processing apparatus 100, according to some embodiments. FIG. 4C illustrates the groove 401 formed in the side surface 402. The groove 401 is configured to receive the O-ring 403. According to some embodiments, the side surface 402 corresponds to a side surface of at least one of the injector holder 118, the sleeve 122, or the gas injector 126. According to some embodiments, the groove 401 corresponds to any of the grooves set forth above. The groove 401 is a geometric shape, such as a partial hexagon or other regular geometric shape. The groove includes the first groove side surface 404, the second groove side surface 406, and the third groove side surface 408. In some embodiments, the first groove side surface 404, the second groove side surface 406, and the third groove side surface 408 are configured to mate with and/or contact a side of the O-ring 403 when the O-ring 403 is received therein or flexibly deformed upon insertion into a receiving member, such as the injector holder 118 or the sleeve 122. According to some embodiments, the groove 401 is formed as a partial hexagon that provides increased surface contact of the O-ring 403 about the first groove side surface 404, the second groove side surface 406, and the third groove side surface 408 compared to a rectangle, and to provide increased resistance to penetration of reactive plasma gas between the side surface 402 and a side surface of an adjacent structural member. According to some embodiments, the groove 401 is defined by the first groove side surface 404, the second groove side surface 406, and the third groove side surface 408 of the gas injector 126 such that the O-ring 403 contacts the first groove side surface 404, the second groove side surface 406, and the third groove side surface 408 when received within the groove 401. A groove having any number of groove side surfaces is contemplated herein, and not merely a groove having three groove side surfaces. Other arrangements and/or configurations of the groove 401 defined within the side surface 402 are within the scope of the present disclosure.

Figure 5:
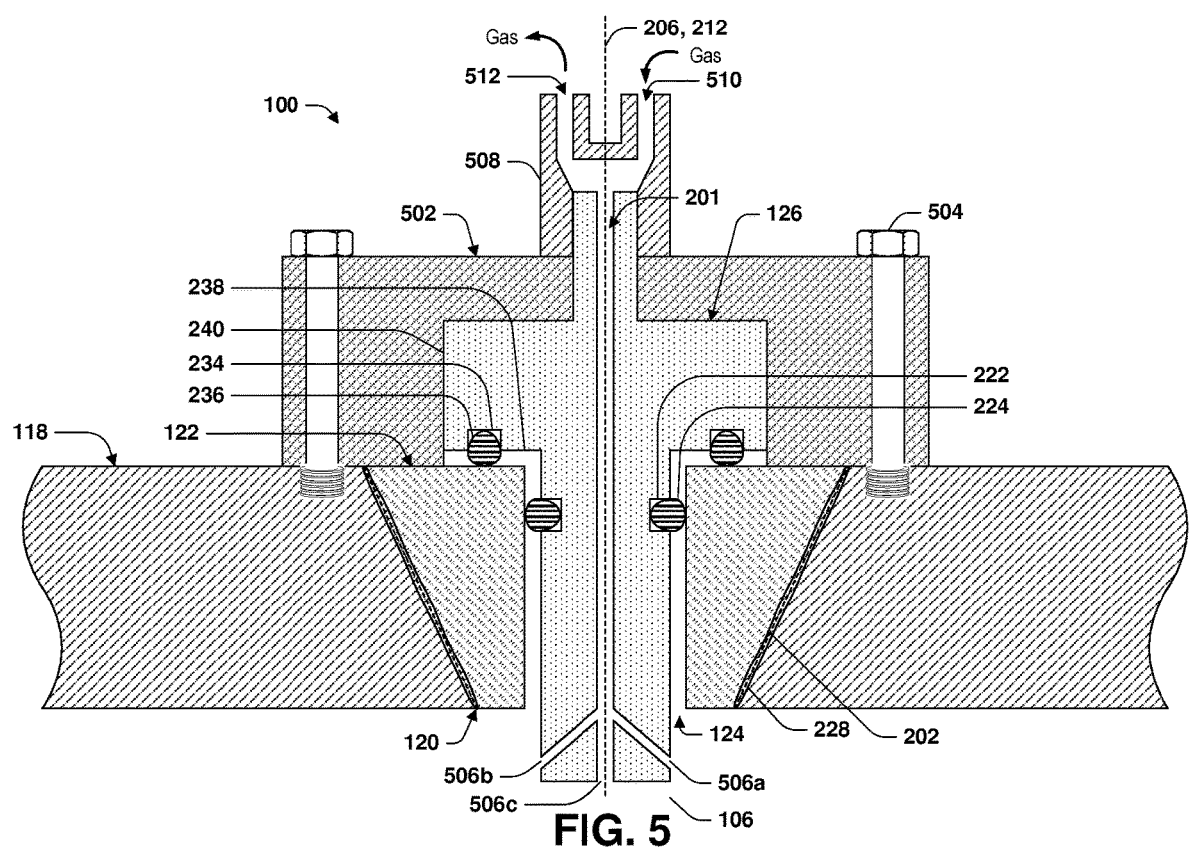
FIG. 5 is a sectional view of at least some of a plasma processing apparatus, such as an injector holder, a sleeve, and/or a gas injector of the plasma processing apparatus, according to some embodiments.

FIG. 5 is a sectional view of at least some of the plasma processing apparatus 100, according to some embodiments. The sleeve 122 is received within the opening 120 of the injector holder 118 and the gas injector 126 is received within the opening 124 of the sleeve 122. The sleeve 122 is adhered to the injector holder 118 with the bonding material 228, such as an adhesive. The gas injector 126 defines the groove 222 about the lower outer periphery, which is configured to receive the O-ring 224. The gas injector 126 defines the third groove 234, which is configured to receive the third O-ring 236. The O-ring 224 and the third O-ring 236 are fixing features to provide a seal between the gas injector 126 and the sleeve 122. A retaining structure 502 encircles and retains the gas injector 126 in position with respect to the injector holder 118. A plurality of retaining members 504 connect the retaining structure 502 to the injector holder 118 and urge the gas injector 126 vertically towards the injector holder 118 and the sleeve 122. As the gas injector 126 is urged towards the sleeve 122, the third O-ring 236 flexibly deforms to provide increased resistance to penetration of reactive plasma gas within the opening 124 in the sleeve 122. According to some embodiments, the gas injector 126 includes a plurality of output channels, such as output channels 506a-c, that connect to the channel 201 and communicate gas to the interior chamber 106 of the plasma processing apparatus 100. A fitting 508 connects to and surrounds an upper portion of the gas injector 126. The fitting 508 includes a first fitting channel 510 to communicate gas from the gas supply 130 to the channel 201. The fitting 508 includes a second fitting channel 512 to communicate gas from the interior chamber 106 of the plasma processing apparatus 100 to an exhaust pump, such as the first exhaust pump 132 and/or the second exhaust pump 134. According to some embodiments, the plurality of output channels, such as output channels 506a-c, provide a more uniform disbursement of gas within the interior chamber 106 of the plasma processing apparatus 100 than a single channel gas injector. Some of the output channels, such as the output channel 506*a* and the output channel 506*c*, are in greater proximity to and/or angled toward the injector holder 118. According to some embodiments, the sleeve 122 may provide increased resistance to interaction of reactive plasma gas output that results from output of gas from some of the plurality of output channels than the injector holder 118. The sleeve 122, for example made from a ceramic material, may provide increased resistance to interaction with the reactive plasma gas than the injector holder, for example, made from a quartz material. Other arrangements and/or configurations of the gas injector 126, the retaining structure 502, and/or the fitting 508 are within the scope of the present disclosure.

Figure 6:
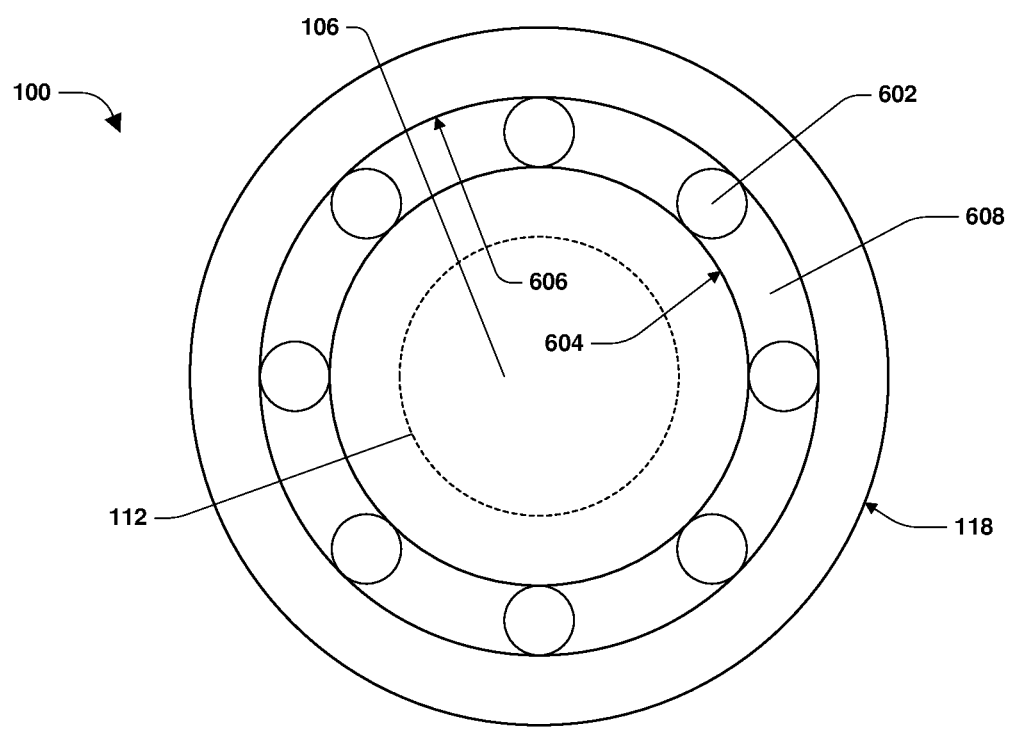
FIG. 6 is a schematic top view of at least some of a plasma processing apparatus, such as an injector holder, a sleeve, and/or a gas injector of the plasma processing apparatus, according to some embodiments.

FIG. 6 is a schematic top view of at least some of the plasma processing apparatus 100, according to some embodiments. A plurality of gas injectors 602 are disposed in a generally circular formation about a top surface of the injector holder 118 to supply gas to the interior chamber 106 of the plasma processing apparatus 100. Any one or more of the plurality of gas injectors 602 may correspond to a gas injector set forth above. According to some embodiments, the plurality of gas injectors 602 are arranged in a regular manner about the top surface of the injector holder 118, but the present disclosure contemplates any arrangement and is not limited to a regular arrangement. According to an embodiment, the plurality of gas injectors 602 are disposed between an inner track 604 and an outer track 606. Any one or more of the plurality of gas injectors 602 is moveable along a circular track 608 formed by the inner track 604 and the outer track 606. For illustration, the material 112 is illustrated within the interior chamber 106 and centered beneath the plurality of gas injectors 602. According to some embodiments, the plurality of gas injectors 602 provided in a moveable configuration may provide increased dispersion of gas within the interior chamber 106 of the plasma processing apparatus 100. Other arrangements and/or configurations of the plurality of gas injectors 602 are within the scope of the present disclosure.

Figure 7:
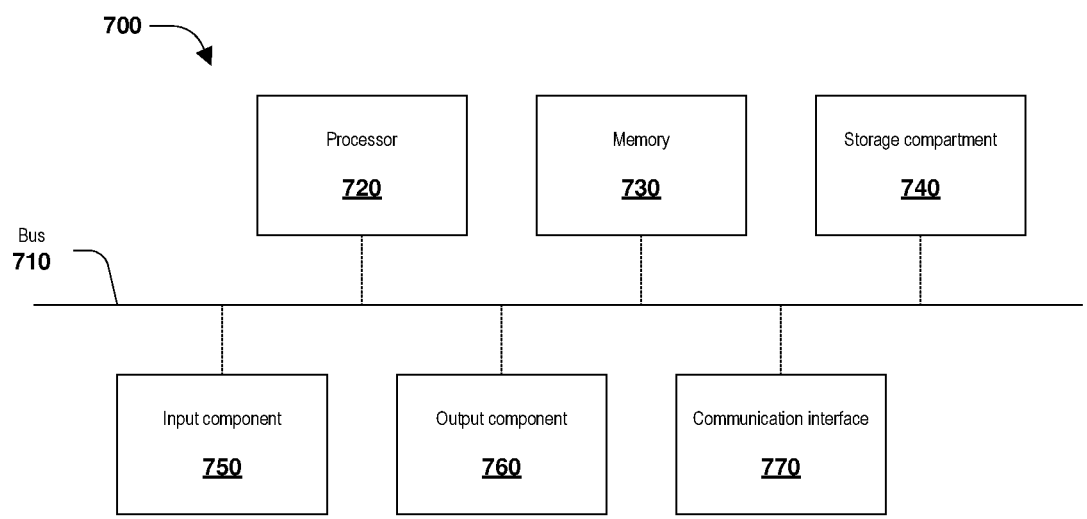
FIG. 7 is a diagram of example components of a device, according to some embodiments.

FIG. 7 is a diagram of example components of a device 700, according to some embodiments. The device 700 may correspond to the controller. As illustrated in FIG. 7, the device 700 may include a bus 710, a processor 720, a memory 730, a storage component 740, an input component 750, an output component 760, and a communication interface 770. The bus 710 includes a component that permits communication among the components of the device 700. The processor 720 is implemented in hardware, firmware, or a combination of hardware and software. The processor 720 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 720 includes one or more processors capable of being programmed to perform a function. The memory 730 includes a random access memory (RAM), a read only memory (ROM), and/or another type of dynamic or static storage device (e.g., a flash memory, a magnetic memory, and/or an optical memory) that stores information and/or instructions for use by the processor 720.

In some embodiments, the storage component 740 stores information and/or software related to the operation and use of the device 700. For example, the storage component 740 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive. The input component 750 includes a component that permits the device 700 to receive information, such as via user input (e.g., a touch screen display, a keyboard, a keypad, a mouse, a button, a switch, and/or a microphone). Additionally, or alternatively, the input component 750 may include a sensor for sensing information (e.g., a global positioning system (GPS) component, an accelerometer, a gyroscope, and/or an actuator). The output component 760 includes a component that provides output information from device 700 (e.g., a display, a speaker, and/or one or more light-emitting diodes (LEDs)). The communication interface 770 includes a transceiver-like component (e.g., a transceiver and/or a separate receiver and transmitter) that enables the device 700 to communicate with other devices, such as via a wired connection, a wireless connection, or a combination of wired and wireless connections. The communication interface 770 may permit the device 700 to receive information from another device and/or provide information to another device. For example, the communication interface 770 may include an Ethernet interface, an optical interface, a coaxial interface, an infrared interface, a radio frequency (RF) interface, a universal serial bus (USB) interface, a Wi-Fi interface, a cellular network interface, and/or the like.

In some embodiments, the device 700 may perform one or more processes described herein. The device 700 may perform these processes based on the processor 720 executing software instructions stored by a non-transitory computer-readable medium, such as the memory 730 and/or the storage component 740. A computer-readable medium is defined herein as a non-transitory memory device. A memory device includes memory space within a single physical storage device or memory space spread across multiple physical storage devices. Software instructions may be read into the memory 730 and/or the storage component 740 from another computer-readable medium or from another device via the communication interface 770. When executed, software instructions stored in the memory 730 and/or the storage component 740 may cause the processor 720 to perform one or more processes described herein. Additionally, or alternatively, hardwired circuitry may be used in place of or in combination with software instructions to perform one or more processes described herein. Thus, implementations described herein are not limited to any specific combination of hardware circuitry and software. The number and arrangement of the components shown in FIG. 7 are provided as an example. In practice, the device 700 may include additional components, fewer components, different components, or differently arranged components than those shown in FIG. 7. Additionally, or alternatively, a set of components (e.g., one or more components) of device 700 may perform one or more functions described as being performed by another set of components of the device 700.

Figure 8:
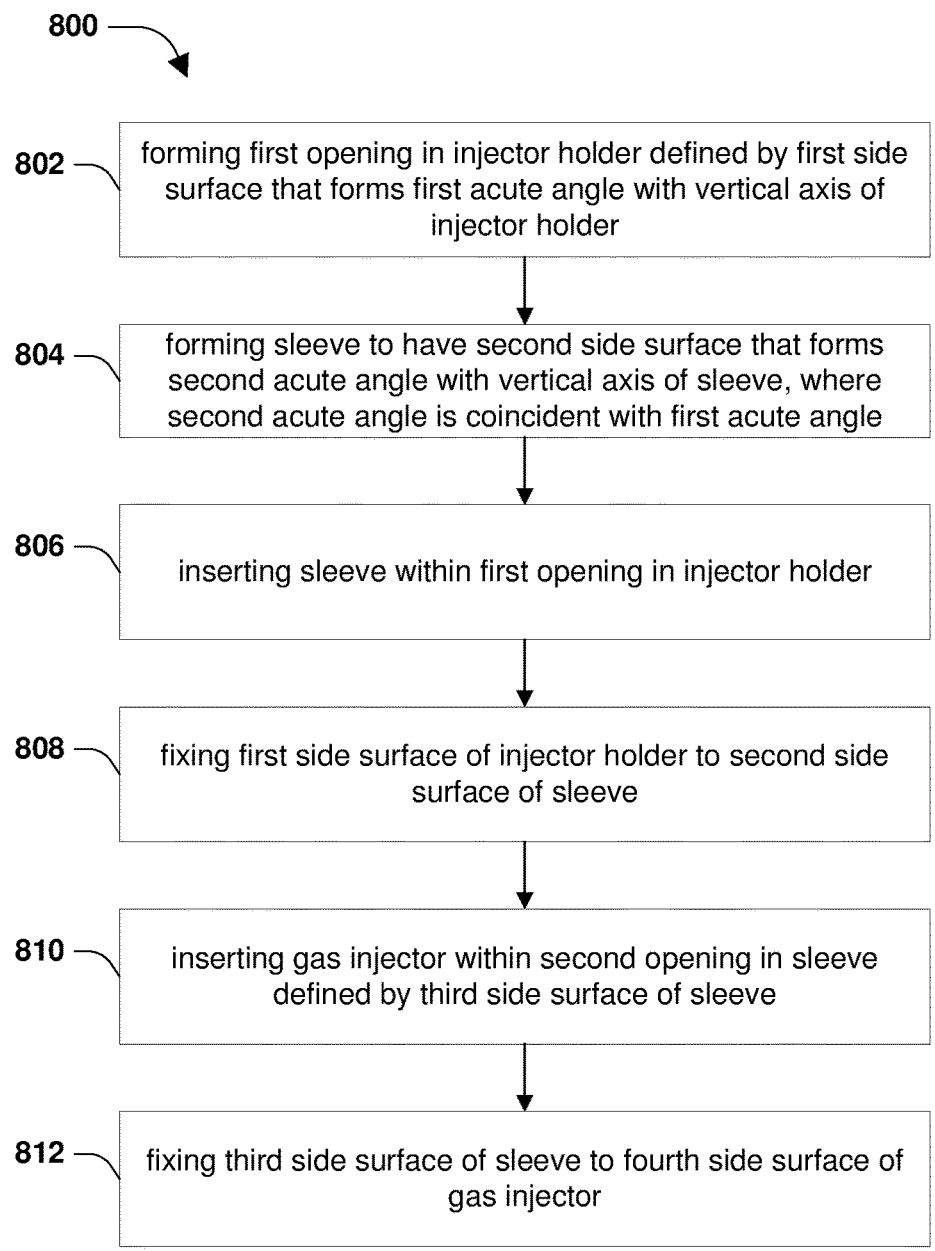
FIG. 8 illustrates a method, according to some embodiments.

FIG. 8 illustrates an example method 800, in accordance with some embodiments. At 802, a first opening is formed in an injector holder where the first opening is defined by a first side surface of the injector holder and the first side surface forms a first acute angle with a vertical axis of the injector holder. At 804, a second side surface of a sleeve is fashioned to form a second acute angle with a vertical axis of the sleeve. The second acute angle is coincident with the first acute angle such that the second side surface mates with the first side surface. At 806, the sleeve is inserted into the first opening in the injector holder. At 808, the first side surface of the injector holder and the second side surface of the sleeve are fixed to one another, such as with an O-ring and/or bonding material. At 810, a gas injector is inserted into a second opening in the sleeve where the second opening is defined by a third side surface of the sleeve. At 812, the third side surface of the sleeve and a fourth side surface of the gas injector are fixed to one another, such as with an O-ring and/or bonding material.

In some embodiments, a plasma processing apparatus is provided. The plasma processing apparatus includes an injector holder configured to removably mate with a structure defining an interior chamber of a plasma processing apparatus. The injector holder defines a first opening. A sleeve is configured to be received within the first opening of the injector holder. The sleeve defines a second opening. A gas injector is configured to be received within the second opening of the sleeve.

According to some embodiments, a plasma processing apparatus is provided. The plasma processing apparatus includes a structure defining an interior chamber. An injector holder is configured to removably mate with the structure to provide access to the interior chamber. The injector holder defines a first opening. A sleeve is configured to be received within the first opening of the injector holder. The sleeve defines a second opening. A gas injector is configured to be received within the second opening of the sleeve. The injector holder has a first material composition, the sleeve has a second material composition, and the gas injector has a third material composition. A removal rate of the second material composition by a plasma generated in the interior chamber is less than at least one of a removal rate of the first material composition by the plasma generated in the interior chamber or a removal rate of the third material composition by the plasma generated in the interior chamber.

According to some embodiments a method is provided. The method includes inserting a sleeve within a first opening in an injector holder of a plasma processing apparatus. The method includes inserting a gas injector within a second opening in the sleeve.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A plasma processing apparatus, comprising:
    an injector holder configured to removably mate with a structure defining an interior chamber of the plasma processing apparatus, the injector holder defining a first opening, wherein the injector holder comprises a first side surface forming a first acute angle with a vertical axis of the injector holder;
    a sleeve configured to be received within the first opening of the injector holder, the sleeve defining a second opening, wherein:

the sleeve comprises a second side surface forming a second acute angle with a vertical axis of the sleeve, and the first acute angle is coincident with the second acute angle such that the first side surface mates with the second side surface; and a gas injector configured to be received within the second opening of the sleeve.

2. The plasma processing apparatus of claim 1, comprising:

a first O-ring, wherein the first O-ring is between the first side surface and the second side surface.

3. The plasma processing apparatus of claim 2, comprising:

a second O-ring, wherein the second O-ring is between the first side surface and the second side surface.

4. The plasma processing apparatus of claim 1, comprising:

a bonding material, wherein the bonding material bonds the first side surface to the second side surface.

5. The plasma processing apparatus of claim 1, wherein:

the injector holder comprises an injector holder side surface including:
the first side surface,
a third side surface contiguous with the first side surface and forming a third angle with the vertical axis of the injector holder, and
a fourth side surface contiguous with the third side surface and forming a fourth angle with the vertical axis of the injector holder, the sleeve comprises a sleeve side surface including:
the second side surface,
a fifth side surface contiguous with the second side surface and forming a fifth angle with the vertical axis of the sleeve, and
a sixth side surface contiguous with the fifth side surface and forming a sixth angle with the vertical axis of the sleeve, and the second side surface mates with the first side surface, the fifth side surface mates with the third side surface, and the sixth side surface mates with the fourth side surface.

6. The plasma processing apparatus of claim 1, comprising:

a first O-ring, wherein:
the sleeve comprises a third side surface,
the gas injector comprises a fourth side surface, and
the first O-ring is between the third side surface and the fourth side surface.

7. The plasma processing apparatus of claim 6, wherein:
a groove is defined within the fourth side surface to receive the first O-ring.

8. The plasma processing apparatus of claim 6, comprising:

a second O-ring, wherein the second O-ring is between the third side surface and the fourth side surface.

9. The plasma processing apparatus of claim 8, comprising:

a third O-ring, wherein:
the sleeve comprises a fifth side surface,
the gas injector comprises a sixth side surface, and
the third O-ring is between the fifth side surface and the sixth side surface.

10. The plasma processing apparatus of claim 1, wherein:
the injector holder has a first material composition; and
the sleeve has a second material composition different than the first material composition.

11. The plasma processing apparatus of claim 10, wherein the gas injector has a third material composition different than the first material composition and different than the second material composition.

12. A plasma processing apparatus, comprising:

a structure defining an interior chamber;
an injector holder configured to removably mate with the structure to provide access to the interior chamber, the injector holder defining a first opening;
a sleeve configured to be received within the first opening of the injector holder, the sleeve defining a second opening; and
a gas injector configured to be received within the second opening of the sleeve, wherein:
the injector holder has a first material composition;
the sleeve has a second material composition;
the gas injector has a third material composition; and
a removal rate of the second material composition by a plasma generated in the interior chamber is less than at least one of a removal rate of the first material composition by the plasma generated in the interior chamber or a removal rate of the third material composition by the plasma generated in the interior chamber.

13. The plasma processing apparatus of claim 12, comprising at least one of:

a first fixing feature between the sleeve and the injector holder; or
a second fixing feature between the sleeve and the gas injector.

14. The plasma processing apparatus of claim 12, wherein:

the injector holder comprises a first side surface forming a first acute angle with a vertical axis of the injector holder,
the sleeve comprises a second side surface forming a second acute angle with a vertical axis of the sleeve, and
the first acute angle is coincident with the second acute angle such that the first side surface mates with the second side surface.

15. The plasma processing apparatus of claim 12, wherein the second material composition comprises a ceramic material.

16. The plasma processing apparatus of claim 12, wherein at least one of the first material composition or the third material composition comprises quartz.

17. A method, comprising:

forming a first opening in an injector holder of a plasma processing apparatus such that the first opening is defined by a first side surface that forms a first acute angle with a vertical axis of the injector holder;
forming a sleeve to have a second side surface that forms a second acute angle with a vertical axis of the sleeve and that is coincident with the first acute angle;
inserting the sleeve within the first opening in the injector holder such that the first side surface mates with the second side surface; and
inserting a gas injector within a second opening in the sleeve.

18. The method of claim 17, comprising:

fixing the second side surface of the sleeve to the first side surface of the injector holder.

19. The method of claim 17, comprising:

fixing a third side surface of the sleeve to a fourth side surface of the gas injector.

20. The method of claim 17, comprising:
providing at least one of a first O-ring or a first bonding material between the injector holder and the sleeve; and
providing at least one of a second O-ring or a second bonding material between the gas injector and the sleeve.

* * * * *